United States Patent
Kim et al.

(10) Patent No.: US 11,462,547 B2
(45) Date of Patent: Oct. 4, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Jin A Kim, Hwaseong-si (KR); Sun Young Lee, Suwon-si (KR); Yong Kwan Kim, Yongin-si (KR); Ji Young Kim, Yongin-si (KR); Chang Hyun Cho, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 8 days.

(21) Appl. No.: 16/991,738

(22) Filed: Aug. 12, 2020

(65) Prior Publication Data

US 2020/0373306 A1  Nov. 26, 2020

Related U.S. Application Data

(63) Continuation of application No. 15/718,737, filed on Sep. 28, 2017, now Pat. No. 10,804,277.

(30) Foreign Application Priority Data

Dec. 13, 2016  (KR) .......................... 10-2016-0169948

(51) Int. Cl.
*H01L 27/108* (2006.01)
*H01L 21/66* (2006.01)

(52) U.S. Cl.
CPC ........ *H01L 27/10885* (2013.01); *H01L 22/26* (2013.01); *H01L 27/10814* (2013.01);
(Continued)

(58) Field of Classification Search
None
See application file for complete search history.

(56) References Cited

U.S. PATENT DOCUMENTS 4,810,666 A  3/1989  Taji
5,362,666 A  11/1994  Dennison
(Continued)

FOREIGN PATENT DOCUMENTS

JP  2000-183313  6/2000
KR  1019990023421  3/1999
(Continued)

*Primary Examiner* — Steven M Christopher
(74) *Attorney, Agent, or Firm* — F. Chau & Associates, LLC

(57) ABSTRACT

A method of fabricating a semiconductor device. A cell area and a core area is defined in a substrate. A bit line structure disposed in the cell area is provided. A gate structure disposed in the core area is provided, and a core capping film disposed on the gate structure is provided. A height of the core capping film is greater than a height of the bit line structure. A first contact film is formed on the bit line structure. A second contact film is formed on the core capping film. A mask is formed on the first contact film. An upper surface of the core capping film is exposed using the mask. The first contact film is etched until a height of the first contact film becomes less than a height of the bit line structure using an etching process. In the etching process, an etching rate for the first contact film is greater than etching rates for the bit line structure and the core capping film.

20 Claims, 19 Drawing Sheets

(52) U.S. Cl.
CPC .. *H01L 27/10823* (2013.01); *H01L 27/10852* (2013.01); *H01L 27/10855* (2013.01); *H01L 27/10876* (2013.01); *H01L 27/10888* (2013.01); *H01L 27/10897* (2013.01)

(56) References Cited

U.S. PATENT DOCUMENTS

| | | | |
|---|---|---|---|
| 5,422,506 A | 6/1995 | Zamapian | |
| 5,863,820 A | 1/1999 | Huang | |
| 6,051,462 A | 4/2000 | Ohno | |
| 6,096,595 A | 8/2000 | Huang | |
| 6,429,068 B1 | 8/2002 | Divakaruni et al. | |
| 6,696,336 B2 * | 2/2004 | DeBoer | H01L 21/76831 |
| | | | 257/E21.019 |
| 7,572,711 B2 * | 8/2009 | Park | H01L 28/91 |
| | | | 438/396 |
| 7,749,834 B2 * | 7/2010 | Park | H01L 27/10855 |
| | | | 438/239 |
| 8,043,923 B2 | 10/2011 | Kim et al. | |
| 8,580,633 B2 | 11/2013 | Cho | |
| 8,766,343 B2 * | 7/2014 | Kang | H01L 27/10852 |
| | | | 257/296 |
| 8,906,763 B2 | 12/2014 | Park et al. | |
| 2003/0139027 A1 * | 7/2003 | Ikeda | H01L 21/823828 |
| | | | 438/592 |
| 2006/0019443 A1 | 1/2006 | Kim et al. | |
| 2010/0019302 A1 * | 1/2010 | Lee | H01L 27/10876 |
| | | | 257/306 |
| 2013/0049123 A1 | 2/2013 | Baars et al. | |
| 2013/0087799 A1 | 4/2013 | Gridelet et al. | |
| 2014/0061782 A1 * | 3/2014 | Kim | H01L 27/088 |
| | | | 257/331 |
| 2014/0175659 A1 | 6/2014 | Lee et al. | |
| 2018/0166450 A1 | 6/2018 | Kim et al. | |

FOREIGN PATENT DOCUMENTS

| | | |
|---|---|---|
| KR | 1020070116490 | 12/2007 |
| KR | 1020080058006 | 6/2008 |
| KR | 100945225 | 2/2010 |
| KR | 1020130004673 | 1/2013 |
| KR | 10-2015-0042623 | 4/2015 |

* cited by examiner

SEMICONDUCTOR DEVICE AND METHOD OF FABRICATING THE SAME

CROSS-REFERENCE TO RELATED APPLICATION

This application is a continuation of U.S. application Ser. No. 15/718,737, filed on Sep. 28, 2017, which claims priority under 35 U.S.C. § 119 to Korean Patent Application No. 10-2016-0169948, filed on Dec. 13, 2016, in the Korean Intellectual Property Office, the disclosures of which are incorporated by reference herein in their entirety.

TECHNICAL BACKGROUND

Example embodiments of the present inventive concept relates to a semiconductor device and a method of fabricating the same.

DISCUSSION OF THE RELATED ART

As semiconductor memory elements become highly integrated, the widths of the individual circuit patterns are becoming finer in order to accommodate more semiconductor elements in the predetermined area. Such miniaturization of circuit patterns may cause multiple issues in the semiconductor element manufacturing process.

Bit lines that can be formed in a cell area of a semiconductor memory element may be more affected by an etching process due to their protruding shape, and a step difference may be generated between the cell area in which the bit lines are formed and a core area.

This step difference may pose additional challenge in securing a process margin for the cell area and the core area, and may make a subsequent process such as a wiring process difficult.

SUMMARY

According to an exemplary embodiment of the present inventive concept, a method of fabricating a semiconductor device includes defining a cell area and a core area in a substrate. The method also includes providing a bit line structure disposed in the cell area, a gate structure disposed in the core area, and a core capping film disposed on the gate structure. A height of the core capping film disposed on the gate structure is greater than a height of the bit line structure. The method further includes forming a first contact film on the bit line structure, forming a second contact film on the core capping film, forming a mask on the first contact film, and exposing an upper surface of the core capping film using the mask. The method further includes etching the first contact film until a height of the first contact film is less than that of the bit line structure using an etching process. The etching rate for the first contact film is greater than the etching rates for the bit line structure and the core capping film.

According to an exemplary embodiment of the present inventive concept, a method of fabricating a semiconductor device includes defining a cell area and a core area in a substrate. The method also includes providing a bit line structure disposed in the cell area, a gate structure disposed in the core area, and a core capping film disposed on the gate structure. A height of the core capping film disposed on the gate structure is greater than a height of the bit line structure. The method further includes forming a contact film on the bit line structure and the core capping film. A height of the contact film formed on the bit line structure is greater than a height of the core capping film. The contact film is etched until the height of the contact film becomes less than a height of the bit line structure using an etching process. An etching rate for the contact film is greater than an etching rate for the bit line structure and the core capping film. A landing pad is formed on the bit line structure and the contact film. A bit line poly is formed on the core capping film. A capacitance is formed on the landing pad.

According to an exemplary embodiment of the present inventive concept, a method of fabricating a semiconductor device includes defining a cell area and a core area in a substrate. The method also includes providing a bit line structure disposed in the cell area, a gate structure disposed in the core area, and a core capping film disposed on the gate structure. A height of the core capping film disposed on the gate structure is greater than a height of the bit line structure. The method further includes forming a first contact film on the bit line structure, forming a second contact film on the core capping film, and forming a mask on the first contact film. The first contact film is etched until a height of the first contact film is less a height of the bit line structure using an etching process. An etching rate for the first contact film is greater than etching rates for the bit line structure and the core capping film.

According to an exemplary embodiment of the present inventive concept, a semiconductor device includes a plurality of bit line structures disposed on the substrate. Each of the bit line structure includes a cell insulating film, a bit line conductive film, a bit line capping film, and a bit line spacer. The semiconductor device also includes a buried contact disposed between the plurality of bit line structures. The buried contact is in direct contact with at least one end of the buried contact. The semiconductor device further includes an element isolation films disposed in the substrate. The semiconductor device also includes a direct contact extending from the bit line conductive film of a portion of the plurality of bit line structures. The semiconductor device further includes a gate structure disposed on the substrate, and a core capping film disposed on the gate structure. A substantially center portion of the element isolation film is connected to the bit line structure by the direct contact. The heights of the plurality of bit line structures are substantially the same as a height of the core capping film.

BRIEF DESCRIPTION OF THE DRAWINGS

The above and other features of the inventive concept will become more apparent by describing in detail exemplary embodiments thereof, with reference to the accompanying drawings, which.

DETAILED DESCRIPTION

Various exemplary embodiments of the present inventive concept will be described more fully hereinafter with reference to the accompanying drawings, in which some exemplary embodiments are shown. The present inventive concept may, however, be embodied in many different forms and should not be construed as limited to the exemplary embodiments set forth herein. A semiconductor device 100 according to an exemplary embodiment of the present inventive concept will hereinafter be described with reference to FIGS. 1 through 3.

It will be understood that when an element such as a layer, film, region, or substrate is referred to as being "on" another element, it can be directly on the other element or intervening elements may also be present.

Figure 1:
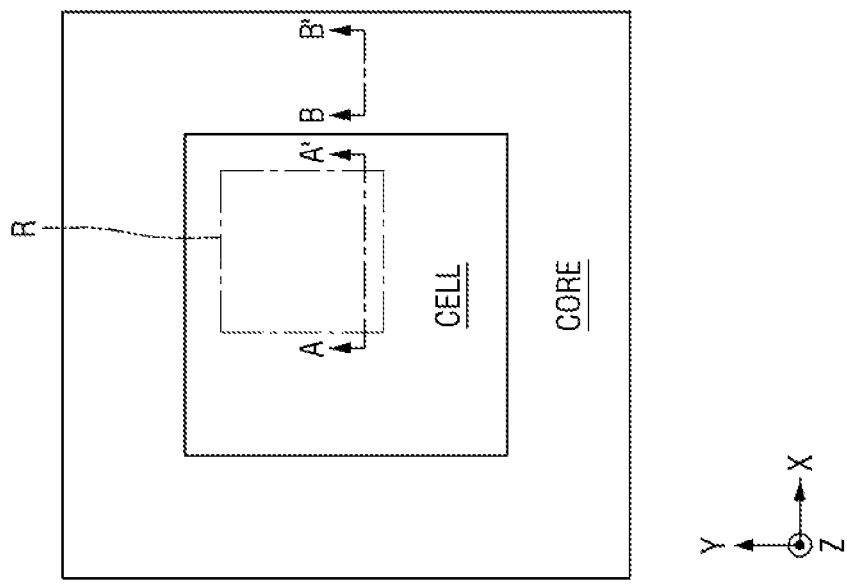
FIG. 1 is a layout view of a semiconductor device according to an exemplary embodiment of the present inventive concept.
Figure 2:
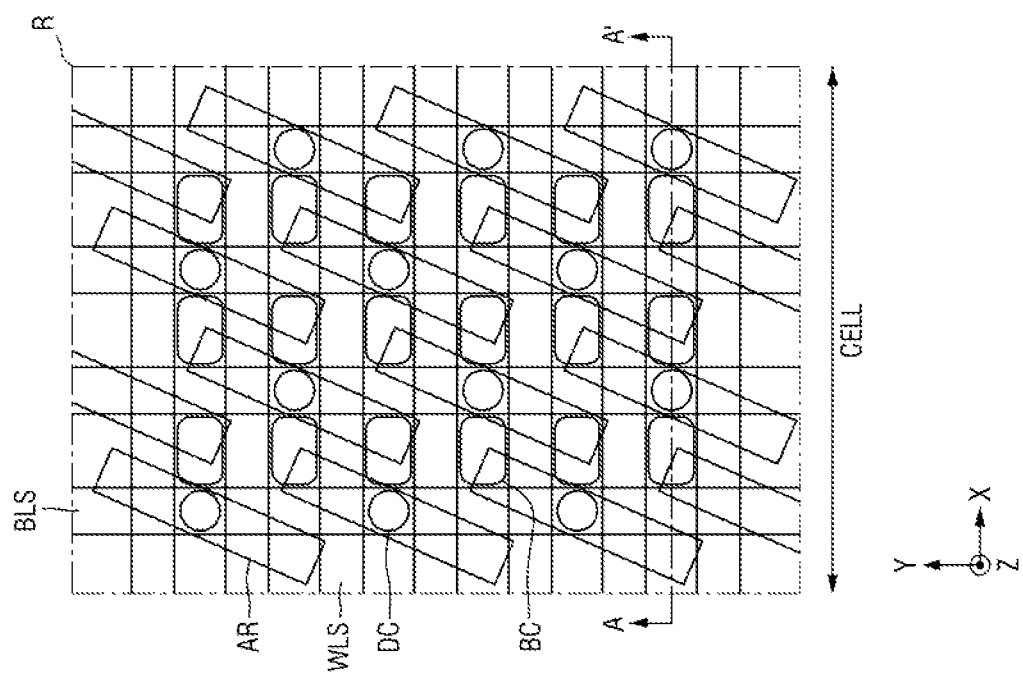
FIG. 2 is an enlarged view of a region 'R' of FIG. 1 according to an exemplary embodiment of the present inventive concept.
Figure 3:
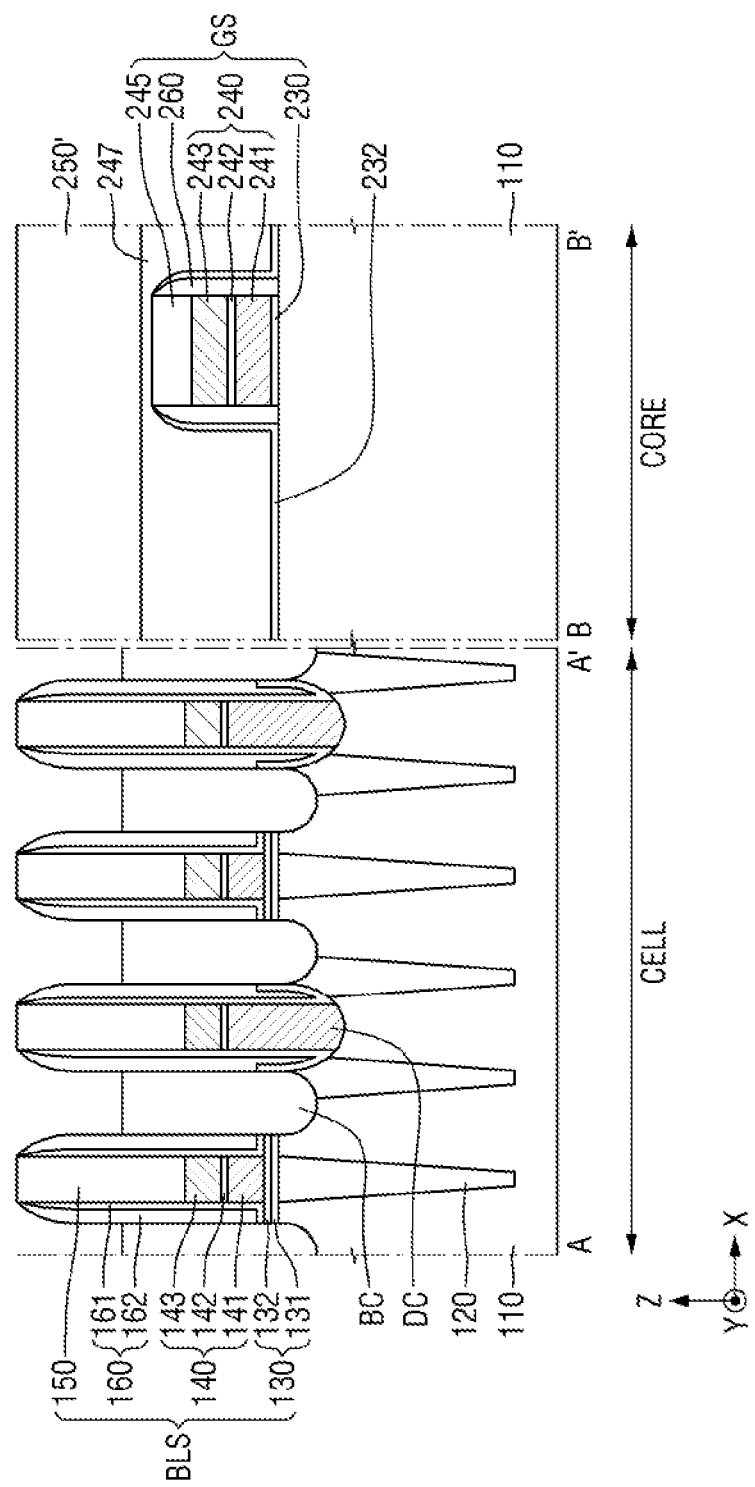
FIG. 3 is a cross-sectional view taken along the lines A-A' and B-B' of FIG. 1 according to one or more exemplary embodiments of the present inventive concept.

FIG. 1 is a layout view of a semiconductor device 100 according to an exemplary embodiment of the present inventive concept. FIG. 2 is an enlarged view of a region 'R' of FIG. 1 according to an exemplary embodiment of the present inventive concept. FIG. 3 is a cross-sectional view taken along the lines A-A' and B-B' of FIG. 1 according to an exemplary embodiment of the present inventive concept.

Referring to 1 through 3, the semiconductor device 100 may include a cell area CELL, and a core area CORE that may be disposed around the cell area CELL.

A plurality of active regions AR, a plurality of word line structures WLS, a plurality of bit line structures BLS, and a plurality of buried contacts BC may be disposed in the cell area CELL to form, for example, semiconductor memory elements on a substrate 110.

The active regions AR may be defined by an element isolation film 120. As the design rule of a semiconductor element is reduced, each of the active regions AR may be disposed in an oblique bar shape as illustrated in FIG. 2.

For example, in a plane in which a first direction X and a second direction Y extend, each of the active regions AR may extend in a bar shape in any direction other than the first direction X and the second direction Y. In addition, the active regions AR may be in the form of a plurality of bars extending parallel to each other, and the substantially center portion of one of the active regions AR may be disposed adjacent to an end portion of another active region AR. On the other hand, in other embodiments, each of the active regions AR may be disposed in a non-oblique bar shape, and may extend in a direction parallel to one of the first direction X or the second direction Y.

Each of the active regions AR may be implanted with impurities to form source and drain regions. Here, implantation of impurities may be achieved by an ion implantation process, but the present disclosure is not limited to the ion implantation process.

For example, the substantially center portion of each of the active regions AR may be connected to a bit line structure BLS by a direct contact DC to form the source and drain regions as illustrated in FIG. 2. In addition, at least one of the both ends of each of the active regions AR may be connected to buried contacts BC to form the source and drain regions.

The word line structures WLS may extend along the first direction X across the substantially entire active regions AR. The word line structures WLS may extend parallel to each other and may be spaced equidistantly.

For example, the word line structures WLS may be buried and extend in the substrate 110. In one example, each of the word line structures WLS may be formed by forming a word line trench extending in the first direction X in the substrate 110 and sequentially burying a gate dielectric film, a word line and a buried insulation film. Accordingly, upper surfaces of the word line structures WLS may be disposed at a height similar to that of an upper surface of the substrate 110.

The bit line structures BLS may be disposed on the substrate 110 to extend across the active regions AR and the word line structures WLS along the second direction Y different from the first direction X. The bit line structures BLS may extend parallel to each other and may be spaced equidistantly.

For example, the second direction Y may be a direction orthogonal to the first direction X. Accordingly, the bit line structures BLS may obliquely cross the active regions AR and perpendicularly cross the word line structures WLS.

Referring to FIG. 3, the semiconductor device 100 may include the element isolation film 120, the bit line structures BLS and the buried contacts BC on the substrate 110 of the cell area CELL. In addition, the semiconductor device 100 may include agate structure GS and a core capping film 250' on the substrate 110 of the core area CORE.

The substrate 110 may be, but is not limited to, a structure in which a base substrate and an epitaxial film may be stacked. The substrate 110 may be a silicon substrate, a gallium arsenide substrate, a silicon germanium substrate, a ceramic substrate, a quartz substrate, a glass substrate for a display, or a semiconductor on insulator (SOI) substrate. The substrate 110 to be described below may be a silicon substrate.

The element isolation film 120 may include, but not limited to, an oxide film, a nitride film, or a combination thereof. The element isolation film 120 may be a single film made of one kind of insulating material or a multi-layered film made of a combination of various kinds of insulating materials.

Each of the bit line structures BLS may include a cell insulating film 130, a bit line conductive film 140, a bit line capping film 150, and a bit line spacer 160.

The cell insulating film 130 may be disposed on the substrate 110 and the element isolation film 120. In one embodiment, as illustrated in FIG. 3, the cell insulating film 130 may be formed on the substrate 110 and the element isolation film 120 in regions of the substrate 110 where the direct contacts DC are not formed.

The cell insulating film 130 may be a single film, but as illustrated in the drawing, for example, in FIG. 3, may also be a multi-layered film including a first cell insulating film 131 and a second cell insulating film 132. In one embodiment, the first cell insulating film 131 may include an oxide film, and the second cell insulating film 132 may include a nitride film. However, the first and second cell insulating films 131, 132 may include material other than the oxide film and the nitride film, respectively.

The bit line conductive film 140 may extend in the second direction Y on the substrate 110 or the cell insulating film 130.

In one embodiment, the bit line conductive film 140 may include the direct contacts DC, and each of the direct contacts DC may be formed at the substantially center portion of an active region AR, as shown, for example, in FIG. 2. For example, portions of the bit line conductive film 140 in which the direct contacts DC are formed may be formed on the substrate 110.

Accordingly, the bit line conductive film 140 may be connected to the substrate 110 by the direct contacts DC, and the active region AR of the substrate 110 connected to each of the direct contacts DC may function as the source and drain regions.

However, the other portions of the bit line conductive film 140 in which the direct contacts DC are not formed may be formed on the cell insulating film 130 and extend in the second direction Y.

The bit line conductive film 140 may be a single film, but as illustrated in the drawing, may also be a multi-layered film including a first bit line conductive film 141, a second bit line conductive film 142, and a third bit line conductive film 143.

For example, each of the first through third bit line conductive films 141 through 143 may include polysilicon, titanium nitride (TiN), titanium silicon nitride (TiSiN), tungsten (W), tungsten silicide (WSi), or a combination thereof. For example, the first bit line conductive film 141 may include polysilicon, the second bit line conductive film 142 may include TiSiN, and the third bit line conductive film 143 may include tungsten.

The bit line capping film 150 may be disposed on the bit line conductive film 140 and extend in the second direction Y. The bit line capping film 150 may include, but not limited to, a silicon nitride film.

The bit line spacer 160 may be disposed on sidewalls of the bit line conductive film 140 and the bit line capping film 150.

In one embodiment, the bit line spacer 160 may be formed on the substrate 110. The bit line spacer 160 may also be formed on the element isolation film 120 and in contact with the portions of the bit line conductive film 140 in which the direct contacts DC are formed. In addition, the bit line spacer 160 may extend in the second direction Y on the sidewalls of the bit line conductive film 140 and the bit line capping film 150.

However, in the other portions of the bit line conductive film 140 in which the direct contacts DC are not formed, the bit line spacer 160 may be formed on the cell insulating film 130 and may extend in the second direction Y on the sidewalls of the bit line conductive film 140 and the bit line capping film 150.

The bit line spacer 160 may be a single film, but as illustrated in the drawing, for example, in FIG. 3, may also be a multi-layered film including a first bit line spacer 161 and a second bit line spacer 162.

For example, the first and second spacers 161 and 162 may include, but not limited to, a silicon oxide film, a silicon nitride film, air, or a combination thereof.

The buried contacts BC may be disposed on the substrate 110 between the bit line structures BLS. In one embodiment, as illustrated in FIG. 2, the buried contacts BC may be disposed in regions defined by the word line structures WLS and the bit line structures BLS, and may form a plurality of isolated regions separated from each other. Each of the buried contacts BC may overlap an end portion of the active region AR. In addition, upper surfaces of the buried contacts BC may be lower than upper surfaces of the bit line structures BLS.

Accordingly, the buried contacts BC may be connected to the active regions AR, and each of the active region AR connected to the buried contacts BC may function as the source and drain regions.

As illustrated in FIG. 1, the core area CORE may be disposed around the cell area CELL. In the core area CORE, control elements such as the gate structure GS and dummy elements may be formed to control the functions of, for example, the semiconductor memory elements formed in the cell area CELL.

The gate structure GS may include a gate dielectric film 230, a gate conductive film 240, a gate capping film 245 and a gate spacer 260.

The gate dielectric film 230 may be disposed on the substrate 110 and extend in the second direction Y. The gate dielectric film 230 may include a silicon oxide film, a silicon nitride film, a silicon oxynitride film, oxide/nitride/oxide (ONO), or a high-k dielectric film having a higher dielectric constant than a silicon oxide film.

For example, the gate dielectric film 230 may include, but not limited to, hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), or a combination thereof.

The gate conductive film 240 may be disposed on the gate dielectric film 230 and extend in the second direction Y.

The gate conductive film 240 may be a single film, but as illustrated in the drawing, may also be a multi-layered film including a first gate conductive film 241, a second gate conductive film 242, and a third gate conductive film 243.

For example, each of the first through third gate conductive films 241 through 243 may include polysilicon, titanium nitride (TiN), titanium silicon nitride (TiSiN), tungsten (W), tungsten silicide (WSi), or a combination thereof. For example, the first gate conductive film 241 may include polysilicon, the second gate conductive film 242 may include TiSiN, and the third gate conductive film 243 may include tungsten.

The gate capping film 245 may be disposed on the gate conductive film 240 and extend in the second direction Y. Here, the gate capping film 245 may include, but not limited to, a silicon nitride film.

The gate spacer 260 may be disposed on the sidewalls of the gate dielectric film 230, the gate conductive film 240, and the gate capping film 245.

In one example, the gate spacer 260 may be formed on the substrate 110, and may extend on the sidewalls of the gate dielectric film 230, the gate conductive film 240 and the gate capping film 245 in the second direction Y.

The gate spacer 260 may include, but not limited to, a silicon oxide film, a silicon nitride film, air, or a combination thereof.

As illustrated in the drawing, the gate spacer 260 may be a single film. However, the present disclosure is not limited to this case, and the gate spacer 260 may also be a multi-layered film.

The bit line structures BLS and the gate structure GS may have different heights. In some embodiments, the bit line structures BLS may be higher than the gate structure GS.

However, the bit line structures BLS and the gate structure GS can be simultaneously formed in the same process and thus have the same height.

The core capping film 250' may be disposed on the gate structure GS. In some embodiments, an upper surface of the core capping film 250' may lie in substantially the same plane as the upper surfaces of the bit line structures BLS. For example, the heights of the bit line structures BLS may be substantially equal to the height of the core capping film 250'. Accordingly, the semiconductor device 100 according to an exemplary embodiment of the present inventive concept may have a structure in which there is no step difference between the cell area CELL and the core area CORE.

Unlike the illustration in the drawing in FIG. 3, in some embodiments, the upper surface of the core capping film 250' may be formed lower than the upper surfaces of the bit line structures BLS. For example, the heights of the bit line structures BLS may be greater than the height of the core capping film 250'. Accordingly, the semiconductor device 100 according to one or more exemplary embodiments of the present inventive concept may have a structure in which a step difference between the cell area CELL and the core area CORE is reversed. For example, the heights of the bit line structures BLS may be less than the height of the core capping film 250'.

In some embodiments, an insulating liner 232 and a core insulating film 247 may be interposed between the core capping film 250' and the gate structure GS, or between the core capping film 250' and the substrate 110. In one embodiment, the insulating liner 232 may be formed on the substrate 110 and the gate spacer 260, and the core insulating film 247 may be disposed on the insulating liner 232 and the gate capping film 245. However, forming the insulating liner 232 and the core insulating film 247 can also be omitted.

As described above, since a step difference between the bit line structures BLS and the core capping film 250' may be removed in the semiconductor device 100 according to one or more exemplary embodiments of the present inventive concept, a process margin for processing the cell area CELL and the core area CORE may be secured, which may facilitate subsequent processes such as a wiring process.

If there is a step difference between the bit line structures BLS and the core capping film 250', the step difference may be further intensified in subsequent processes. For example, the bit line structures BLS protruding from the substrate 110 may be more susceptible to being affected by an etching process than the flat core capping film 250'. Accordingly, the step difference between the bit line structures BLS and the core capping film 250' may be further increased. The step difference between the cell area CELL and the core area CORE can make it difficult to secure the process margin and make subsequent processes such as the wiring process difficult.

In addition, the semiconductor device 100 according to an exemplary embodiment of the present inventive concept may secure its reliability by preventing pattern defects. This will be described in detail with reference to FIG. 4.

A semiconductor device 100 according to an exemplary embodiment of the present inventive concept will hereinafter be described with reference to FIG. 4. For ease of description, a description of elements and features identical to those described above with reference to FIGS. 1 through 3 will be given briefly or omitted.

Figure 4:
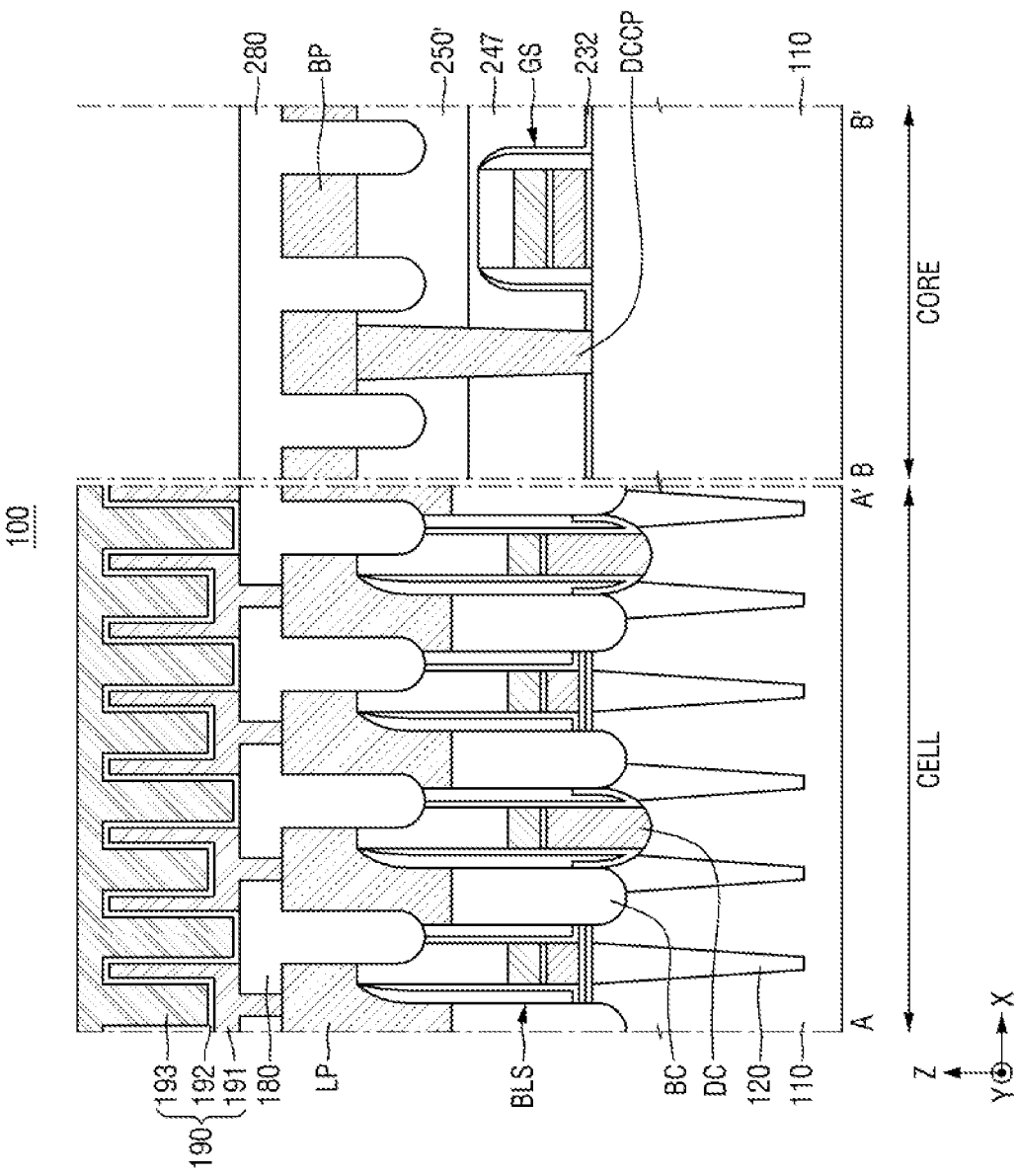
FIG. 4 is a cross-sectional view of a semiconductor device according to an exemplary embodiment of the present inventive concept.

FIG. 4 is a cross-sectional view of a semiconductor device 100 according to an exemplary embodiment of the present inventive concept.

The semiconductor device 100 of FIG. 4 may further include a plurality of landing pads LP, a first interlayer insulating film 180, and a capacitance 190 in the cell area CELL of the semiconductor device 100 of FIG. 3. In addition, the semiconductor device 100 of FIG. 4 may further include a direct contact plug DCCP, a plurality of bit line polys BP, and a second interlayer insulating film 280 in the core area CORE of the semiconductor device 100 of FIG. 3.

Each of the landing pads LP may be disposed on portions of an upper surface of the bit line structure BLS and on an upper surface of the buried contact BC. Like the buried contacts BC of FIG. 2, the landing pads LP may form a plurality of isolated regions spaced apart from each other. The landing pads LP may be connected to the buried contacts BC.

For example, the landing pads LP may include a conductive material and may be electrically connected to the buried contacts BC. For example, the landing pads LP may include, but not limited to, tungsten (W).

The first interlayer insulating film 180 may be disposed on portions of the upper surface of each of the landing pads LP and portions of the upper surface of each of the bit line structures BLS to define the regions of the landing pads LP that may form a plurality of isolated regions. The first interlayer insulating film 180 may separate the landing pads LP from each other. In addition, the first interlayer insulating film 180 may be patterned to expose portion of the upper surface of each of the landing pads LP.

For example, the first interlayer insulating film 180 may include an insulating material and may electrically isolate the landing pads LP from each other. For example, the first interlayer insulating film 180 may include a silicon oxide film.

The capacitance 190 may be disposed on the first interlayer insulating film 180 and the landing pads LP to store electric charges in, for example, the semiconductor memory element. For example, the capacitance 190 may be connected to a portion of the upper surface of each of the landing pads LP which is not blocked by the first interlayer insulating film 180. As a result, the capacitance 190 may be electrically connected to the source and drain regions connected to the buried contacts BC and store electric charges in, for example, the semiconductor memory element.

For example, as illustrated in FIG. 4, the capacitance 190 may include a lower electrode 191, a capacitance dielectric film 192, and an upper electrode 193 to store electric charges. For example, the capacitance 190 may store electric charges in the capacitance dielectric film 192 by a potential difference generated between the lower electrode 191 and the upper electrode 193.

The lower electrode 191 and the upper electrode 193 may include, but not limited to, doped polysilicon, metal, or metal nitride. In addition, the capacitance dielectric film 192 may include, but not limited to, silicon oxide or the high-k material.

The direct contact plug DCCP may extend from an upper surface of the core capping film 250' in a third direction Z and may pass through the core capping film 250' and/or a core insulating film 247 to be connected to a substrate 110. The direct contact plug DCCP may be disposed adjacent to the gate structure GS and connected to the source and drain regions of the substrate 110. However, the present disclosure is not limited to this case.

The direct contact plug DCCP may be formed at the same time as the landing pads LP formed in the cell area CELL.

The direct contact plug DCCP may include, but not limited to, for example, tungsten (W).

The bit line polys BP may be disposed on the core capping film 250' and may be a plurality of wiring layers spaced apart from each other and extending in the second direction Y. Some of the bit line polys BP may be connected to the direct contact plug DCCP.

The bit line polys BP may be formed at the same time as the landing pads LP formed in the cell area CELL. The bit line polys BP may include, but not limited to, for example, tungsten (W).

In addition, the bit line polys BP and the landing pads LP may be patterned simultaneously. For example, the bit line polys BP and the landing pads LP may be separated from each other in the first direction X by the same process.

However, if there is a step difference between the bit line structures BLS and the core capping film 250' prior to patterning the landing pads LP and the bit line polys BP, a pattern defect may occur in the patterning process.

For example, if the core capping film 250' is higher than the bit line structures BLS, an etch depth for patterning the bit line polys BP may not reach an etch depth for patterning the landing pads LP. Accordingly, while the bit line polys BP can be completely separated from each other, the landing pads LP may be connected to each other without being completely separated. The landing pads LP unintentionally connected to each other may reduce the reliability of the semiconductor device 100.

Therefore, an exemplary embodiment of the present inventive concept is to remove the step difference between the bit line structures BLS and the core capping film 250' to secure a process margin for processing the cell area CELL and the core area CORE, thereby securing the reliability of the semiconductor device 100.

A method of fabricating a semiconductor device 100 according to an exemplary embodiment of the present inventive concept will hereinafter be described with reference to FIGS. 5 through 12. For ease of description, description of elements and features identical to those described above with reference to FIGS. 1 through 4 will be given briefly or omitted.

FIGS. 5 through 12 are cross-sectional views illustrating operations of a method of fabricating a semiconductor device 100 according to one or more exemplary embodiments of the present inventive concept.

Figure 5:
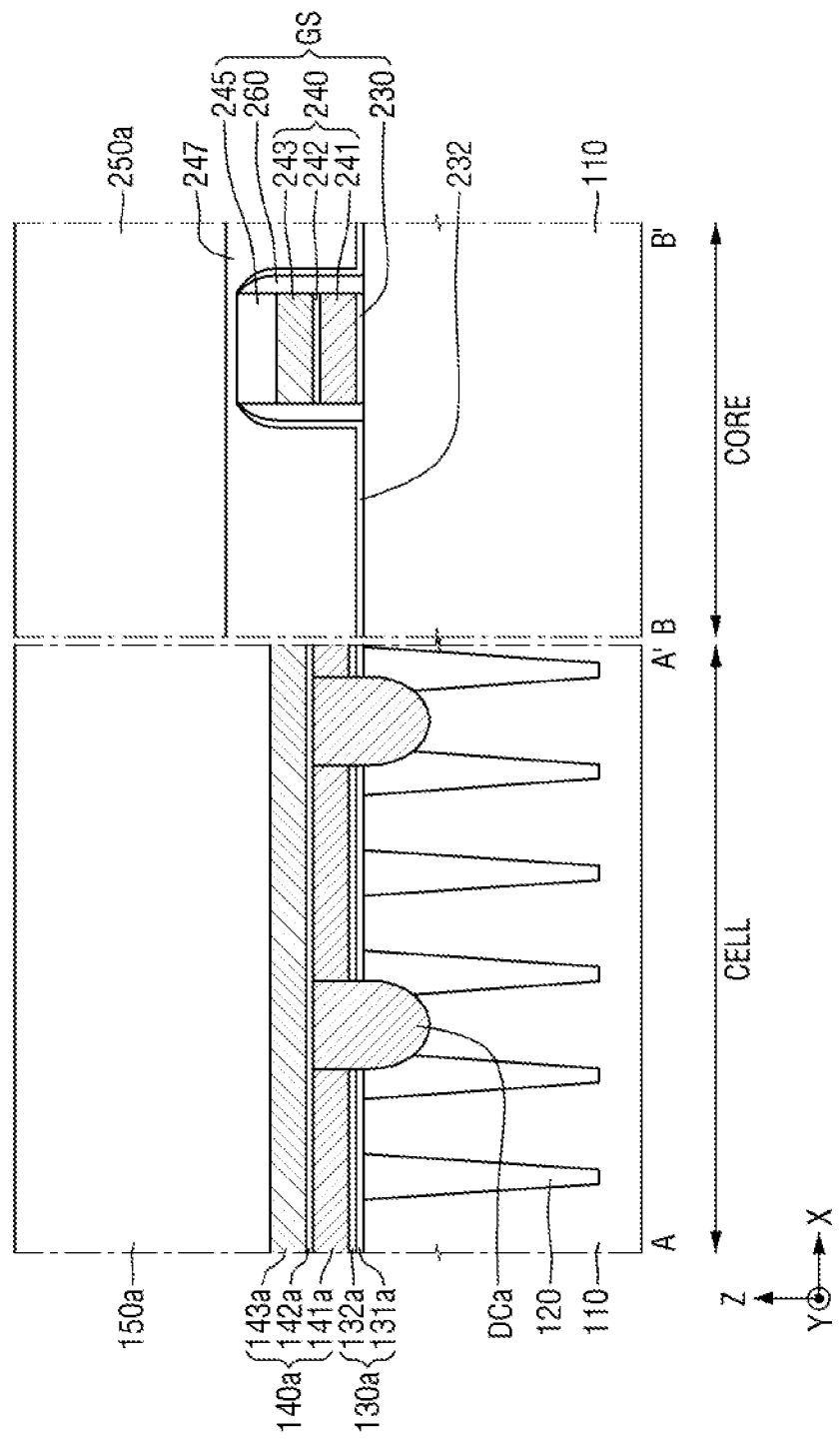
FIGS. 5 through 12 are cross-sectional views illustrating operations of a method of fabricating a semiconductor device according to one or more exemplary embodiments of the present inventive concept.

Referring to FIG. 5, the cell area CELL and the core area CORE are defined in a substrate 110. Various films for forming the bit line structures BLS of FIG. 3 may be provided in the cell area CELL, and the gate structure GS and a core capping film 250a may be provided in the core area CORE. As illustrated in FIG. 5, the element isolation film 120 may be formed in the substrate 110 to define the active regions AR of FIG. 2.

For example, some control elements such as the gate structure GS and dummy elements may be provided in the core area CORE. The gate structure GS may include the gate dielectric film 230, the gate conductive film 240, the gate capping film 245, and the gate spacer 260. Since the gate structure GS has been described above with reference to FIG. 3, a detailed description of the gate structure GS will be omitted.

In addition, a cell insulating film 130a, a bit line conductive film 140a including direct contacts DCa connected to the substrate 110, and a bit line capping film 150a may be sequentially formed on the substrate 110 in the cell area CELL.

For example, the cell insulating film 130a may be formed on the substrate 110 and the isolation film 120. However, the cell insulating film 130a may be removed from one or more regions of the substrate 110 by etching. As shown in FIG. 5, the cell insulating film 130a may be removed from one or more regions where the direct contacts DCa are formed on the substrate 110. For example, the cell insulating film 130a may be etched away from the substantially center portion of each of the active regions AR, where the direct contacts DCa are formed as illustrated in FIG. 2. As illustrated in FIG. 5, the cell insulating film 130a may be formed on the portions of the substrate 110 where the direct contacts DCa are not formed. The cell insulating film 130a may also be formed on the portions of the isolation film 120 in which the direct contacts DCa are not formed.

The cell insulating film 130a may be a single film, but as illustrated in the FIG. 5, for example, may include a multi-layered film including a first cell insulating film 131a and a second cell insulating film 132a. For example, the first cell insulating film 131a may include the oxide film, and the second cell insulating film 132a may include the nitride film.

The bit line conductive film 140a may include the direct contacts DCa, and may be formed on one of the substrate 110, the element isolation film 120, or the cell insulating film 130a. The bit line conductive film 140a may be a single film, but as illustrated in the drawing, may also be a multi-layered film including a first bit line conductive film 141a, a second bit line conductive film 142a, and a third bit line conductive film 143a.

For example, each of the first through third bit line conductive films 141a through 143a may include polysilicon, titanium nitride (TiN), titanium silicon nitride (TiSiN), tungsten (W), tungsten silicide (WSi), or a combination thereof. For example, the first bit line conductive film 141a may include polysilicon, the second bit line conductive film 142a may include TiSiN, and the third bit line conductive film 143a may include tungsten.

The cell insulating film 130a may be formed on the substrate 110 and the element isolation film 120, and the first bit line conductive film 141a may be formed on the cell insulating film 130a to form a stacked structure. Then, portions of the stacked structure overlapping the substantially center portion of each of the active regions AR (as shown in FIG. 2) may be removed, and the removed portions may be filled with a conductive material. Accordingly, the direct contact DCa connected to the substrate 110 may be formed at the substantially center portion of each of the active regions AR as shown, for example, in FIG. 2. Here, the direct contacts DCa may be made of, but not necessarily, the same material as the first bit line conductive film 141a.

Next, the second and third bit line conductive films 142a and 143a may be formed on the direct contacts DCa and the first bit line conductive film 141a. Accordingly, the bit line conductive film 140a may include the direct contacts DCa, and may be formed on the substrate 110, the element isolation film 120, and the cell insulating film 130a.

As shown in FIG. 5, the bit line capping film 150a and the core capping film 250a may be formed on the bit line conductive film 140a and the gate structure GS, respectively. Here, the bit line capping film 150a and the core capping film 250a may be formed simultaneously by the same process. The upper surface of the bit line capping film 150a and the upper surface of the core capping film 250a may lie in substantially the same plane by a planarization process.

The bit line capping film 150 and the core capping film 250a may include, but not limited to, a silicon nitride film.

Figure 6:
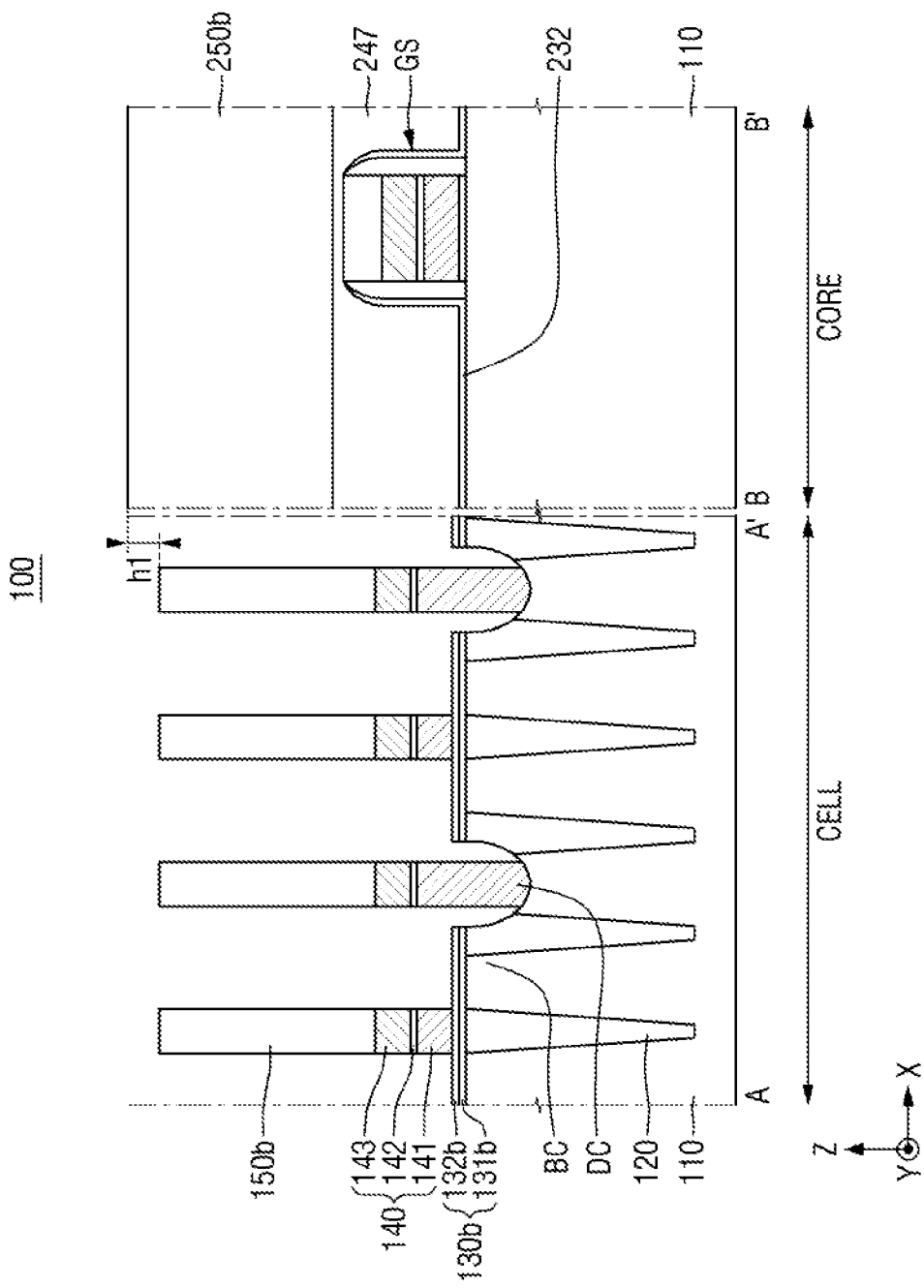

Referring to FIG. 6, the bit line conductive film 140a and the bit line capping film 150a may be partially removed to form the bit line conductive film 140 and the bit line capping film 150b which extend in the second direction Y on the substrate 110 and the cell insulating film 130b.

For example, at least a portion of the bit line conductive film 140a and the bit line capping film 150a shown in FIG. 5 may be removed by a photolithography process to form a bit line conductive film 140 and a bit line capping film 150. The cell insulating film 130b may work as an etch-stop film.

In one embodiment, the bit line conductive film 140 including the direct contacts DC may be formed on, and connected to the substrate 110, extending in the second direction Y in the cell area CELL. For example, one portion of the bit line conductive film 140 may extend in the second direction Y on the cell insulating film 130b, and the other portion of the bit line conductive film 140 may be connected to the substrate 110 by the direct contact DC of the bit line conductive film 140 at the substantially center portion of each of the active regions AR (see, for example FIG. 2).

In addition, the bit line capping film 150b may be formed on the bit line conductive film 140, and extend in the second direction Y in the cell area CELL. Here, the upper surface of the bit line capping film 150b may be lower than the upper surface of the core capping film 250b. For example, the upper surface of the bit line capping film 150b and the upper surface of the core capping film 250b may have a first step difference h1.

The first step difference h1 may result from the protruding shape of the bit line capping film 150b. For example, due to its protruding shape, the bit line capping film 150b may be susceptible to being affected more than the core capping film 250b of the core area CORE with a flat surface during the photoresist (PR) stripping process in which the photoresist used in the photolithography process is removed and/or a cleaning operation.

For example, the bit line conductive film 140 and the bit line capping film 150b may be formed to be protruded from the substrate 110, and may extend in the second direction Y by the etching process using the photolithography process. In the subsequent operation of the photoresist removal and/or the cleaning operation, the protruding bit line capping film 150b may be more susceptible to being affected than the flat core capping film 250b.

Accordingly, the height of the upper surface of the bit line capping film 150b may be less than the height of the upper surface of the core capping film 250b, and may generate the first step difference h1. This phenomenon can be further exacerbated for the highly integrated semiconductor device.

Figure 7:
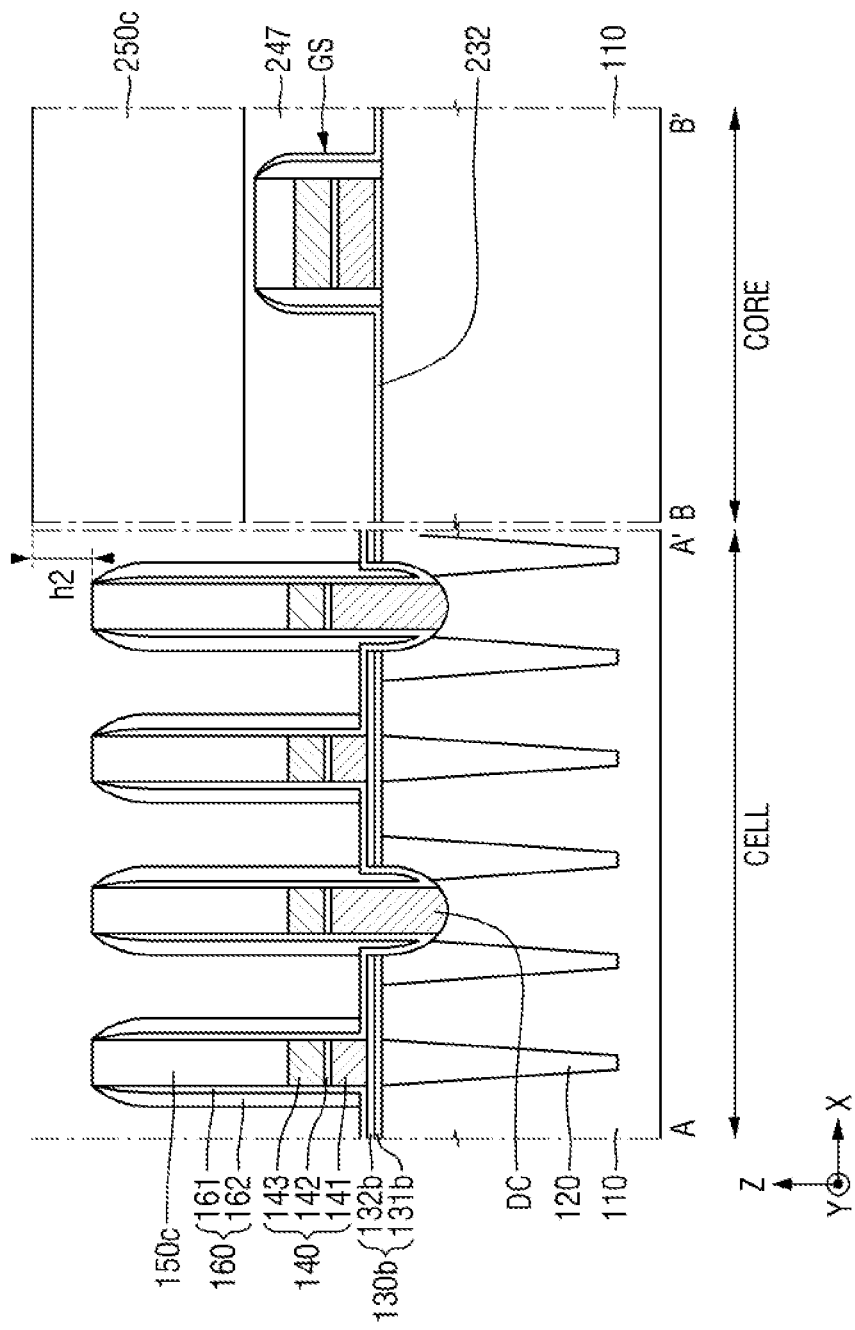

Referring to FIG. 7, the bit line spacer 160 may be formed on exposed sidewalls of the bit line conductive film 140 and a bit line capping film 150c.

The bit line spacer 160 may be formed on the substrate 110. For example, the bit line spacer 160 may be formed on the element isolation film 120. The bit line spacer 160 may also be disposed between the element isolation film 120 and the portions of the bit line conductive film 140. Further, the bit line spacer 160 may be formed in one or more portions of the bit line conductive film 140 including the direct contacts DC. In addition, the bit line spacer 160 may extend on the sidewalls of the bit line conductive film 140 and the bit line capping film 150c in the second direction Y.

However, in an exemplary embodiment of the present inventive concept, in the other portions of the bit line conductive film 140 in which the direct contacts DC are not formed, the bit line spacer 160 may be formed on the cell insulating film 130b and extend on the sidewalls of the bit line conductive film 140 and the bit line capping film 150c in the second direction Y.

Since the bit line spacer 160 has been described above with reference to FIG. 3, a detailed description of the bit line spacer 160 will be omitted.

The height of the upper surface of the bit line capping film 150c may be less than the height of the core capping film 250c. For example, the upper surface of the bit line capping film 150c and the upper surface of the core capping film 250c may have a second step difference h2, which may be greater than the first step difference h1 as previously shown in FIG. 6.

Like the first step difference h1, the second step difference h2 may result from the protruding shape of the bit line capping film 150c. For example, in the etching process for forming the bit line spacer 160 on the sidewalls of the bit line conductive film 140 and the bit line capping film 150c, the protruding bit line capping film 150c may be more susceptible to being affected than the flat core capping film 250c.

Accordingly, the height of the upper surface of the bit line capping film 150c may be less than the height of the upper surface of the core capping film 250c, and may generate the second step difference h2 that may be greater than the first step difference h1 shown in FIG. 6. This phenomenon may be further exacerbated for the highly integrated semiconductor device.

Figure 8:
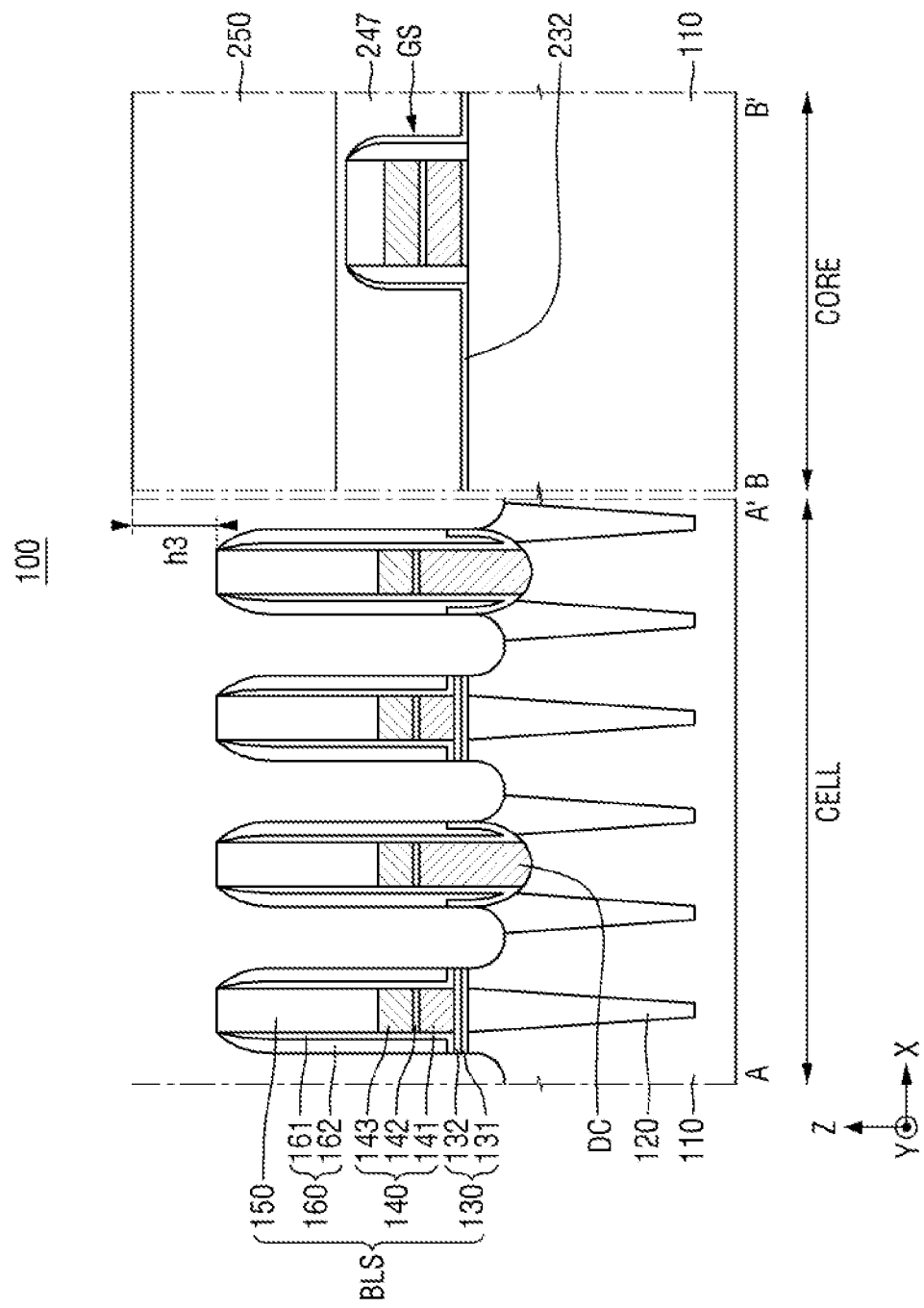

Referring to FIG. 8, the bit line structures BLS may be formed at least by partially removing the substrate 110, the element isolation film 120, and the cell insulating film 130b (shown in FIG. 7) and to form the buried contacts BC (as shown in FIG. 3).

For example, the substrate 110, the element isolation film 120, and the cell insulating film 130b (shown in FIG. 7) may be partially removed by the etching process using the bit line capping film 150 and the bit line spacer 160 as an etch mask. Accordingly, the bit line structures BLS, each including the cell insulating film 130, the bit line conductive film 140, the bit line capping film 150, and the bit line spacer 160, may be formed as illustrated in FIG. 8. Since the bit line structures BLS have been described above with reference to FIG. 3, a detailed description of the bit line structures BLS will be omitted.

Here, the height of the upper surfaces of the bit line structures BLS may be less than the height of the upper surface of the core capping film 250. For example, FIG. 8 illustrates that the upper surfaces of the bit line structures BLS and the upper surface of the core capping film 250 may have a third step difference h3 which may be greater than the second step difference h2 shown in FIG. 7.

Similar to the first and second step differences h1 and h2, the third step difference h3 may result from the protruding shape of the bit line structures BLS. For example, in the etching process for partially removing the substrate 110, the element isolation film 120, and the cell insulating film 130 using the bit line capping film 150 and the bit line spacer 160 as the etch mask, the protruding bit line structures BLS may be more susceptible to being affected than the flat core capping film 250. For example, the bit line capping film 150 and the bit line spacers 160 used as the etch mask may be etched at a faster rate than the core capping film 250 used as the etch mask.

Accordingly, the height of the upper surfaces of the bit line structures BLS may become less than the height of the upper surface of the core capping film 250, and may generate the third step difference h3 which may be greater than the first and second step differences h1 and h2 that are shown in FIGS. 6 and 7, respectively. This phenomenon may be further exacerbated for the highly integrated semiconductor device.

Figure 9:
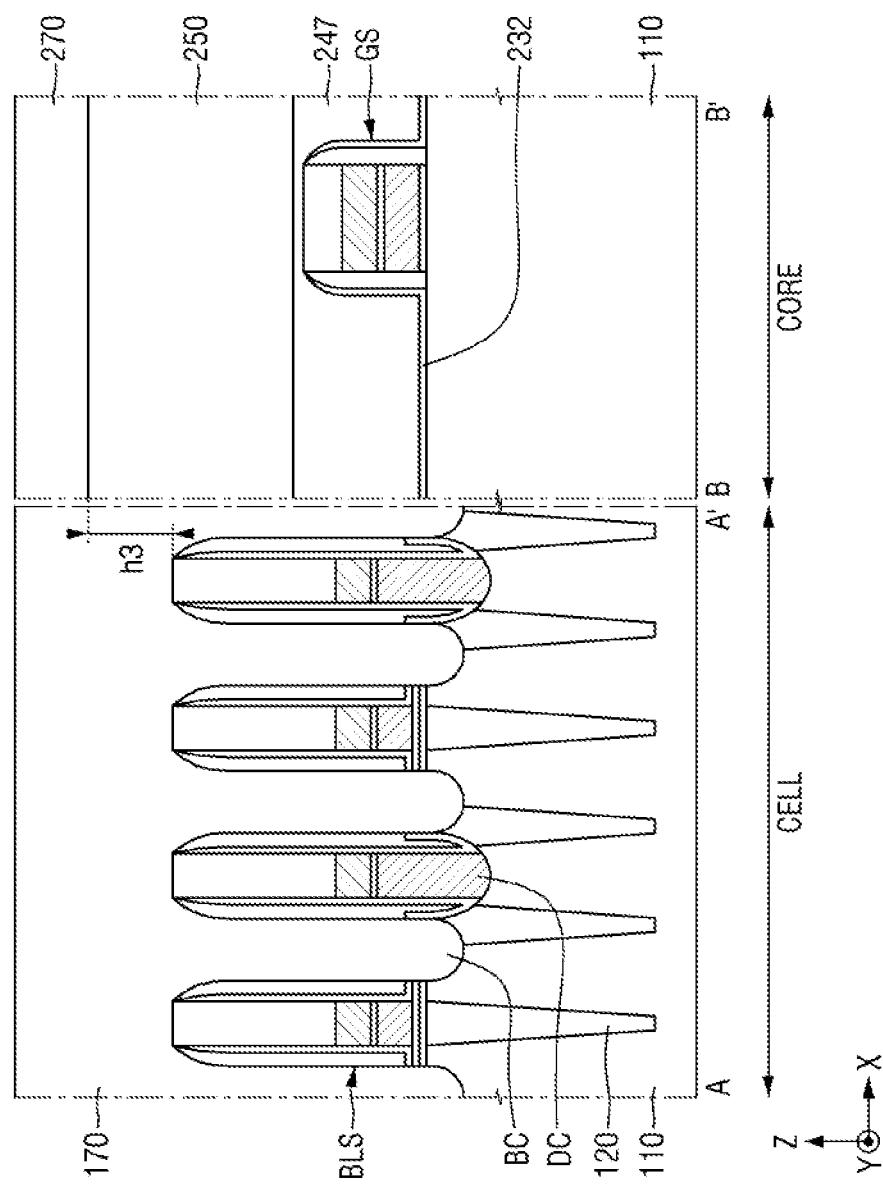

Referring to FIG. 9, a first contact film 170 may be formed on the bit line structures BLS of the cell area CELL, and a second contact film 270 may be formed on the core capping film 250 of the core area CORE.

In one embodiment, the first contact film 170 may be formed on the bit line structures BLS of the cell area CELL to fill regions between the bit line structures BLS. For example, the first contact film 170 may fill regions etched in the etching step shown in FIG. 8, and that the first contact film 170 may be connected to the substrate 110.

An upper surface of the first contact film 170 may be formed to be higher than not only the upper surfaces of the bit line structures BLS but also the upper surface of the core capping film 250.

In some exemplary embodiments, the first contact film 170 may include polysilicon. Here, the polysilicon may be polysilicon doped with an impurity. Also, the first contact film 170 may include metal, metal silicide, metal nitride, or a combination thereof. Accordingly, the first contact film 170 may be electrically connected to the substrate 110.

The second contact film 270 may be formed on the core capping film 250 of the core area CORE.

In some exemplary embodiments of the present inventive concept, the second contact film 270 may be formed in the process of forming the first contact film 170. For example, the first and second contact films 170 and 270 may be formed simultaneously. The second contact film 270 may be made of the same material as the first contact film 170.

In some exemplary embodiments, the first and second contact films 170 and 270 may be formed such that an upper surface of the second contact film 270 lies in substantially the same plane as the upper surface of the first contact film 170. In one embodiment, after the first and second contact films 170 and 270 are respectively formed on the bit line structures BLS and the core capping film 250, they may be planarized. For example, after the first and second contact films 170 and 270 are respectively formed on the bit line structures BLS and the core capping film 250, they may be planarized by a chemical mechanical polishing (CMP) process, and make the upper surfaces of the bit line structures BLS and the surface of the core capping film 250 in substantially the same plane with each other.

Figure 10:
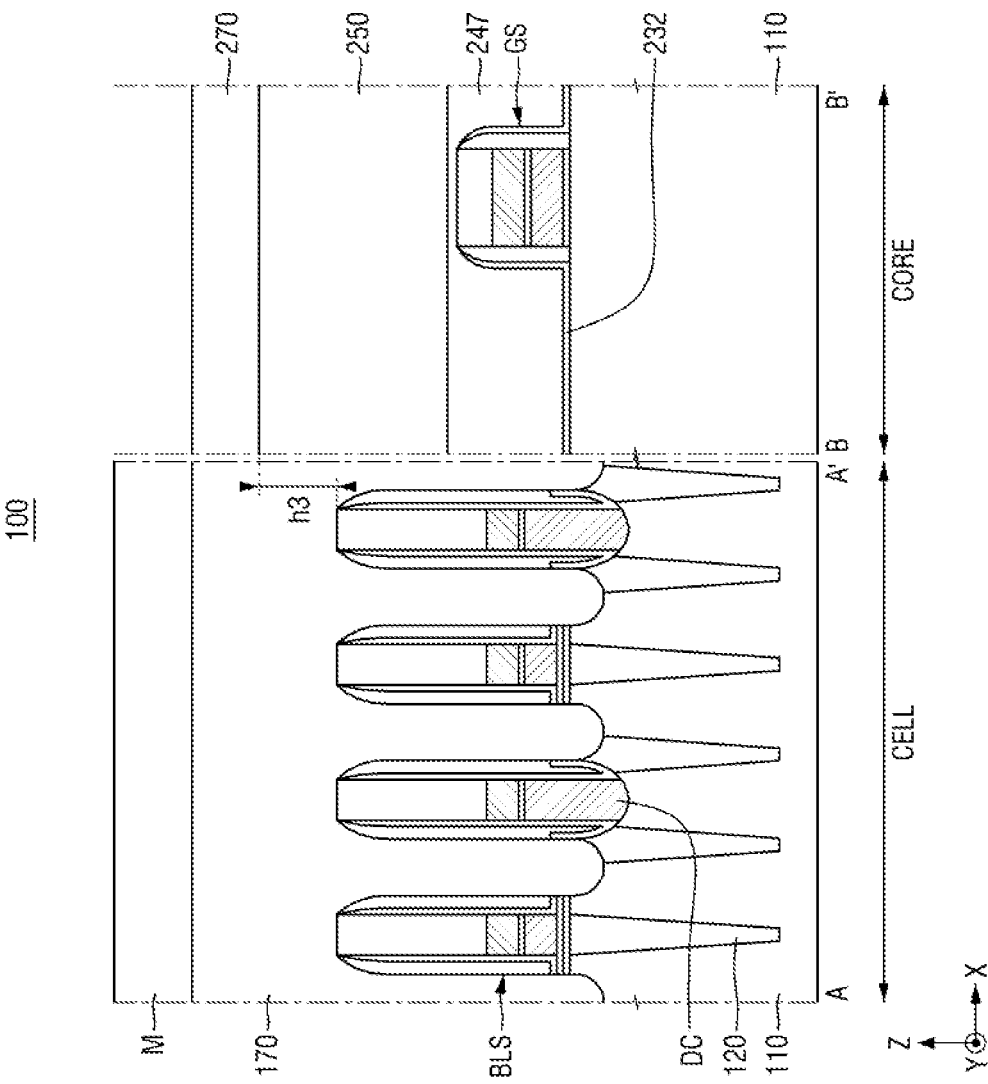

Referring to FIG. 10, a mask M may be formed on the first contact film 170.

In some exemplary embodiments, the mask M may be formed on the first contact film 170 by the photolithography process. The mask M may be photoresist.

In one embodiment, the photoresist may be formed on the first and second contact films 170 and 270, respectively, and the photoresist formed on the second contact film 270 may be removed through exposure and development processes. For example, when a positive photolithography process is used, the photoresist may be formed on the first and second contact films 170 and 270, and the photoresist formed on the second contact film 270 may be exposed. Then, the exposed photoresist on the second contact film 270 may be removed in the development process. Accordingly, the photoresist on the first contact film 170 may be formed as the mask M.

Figure 11:
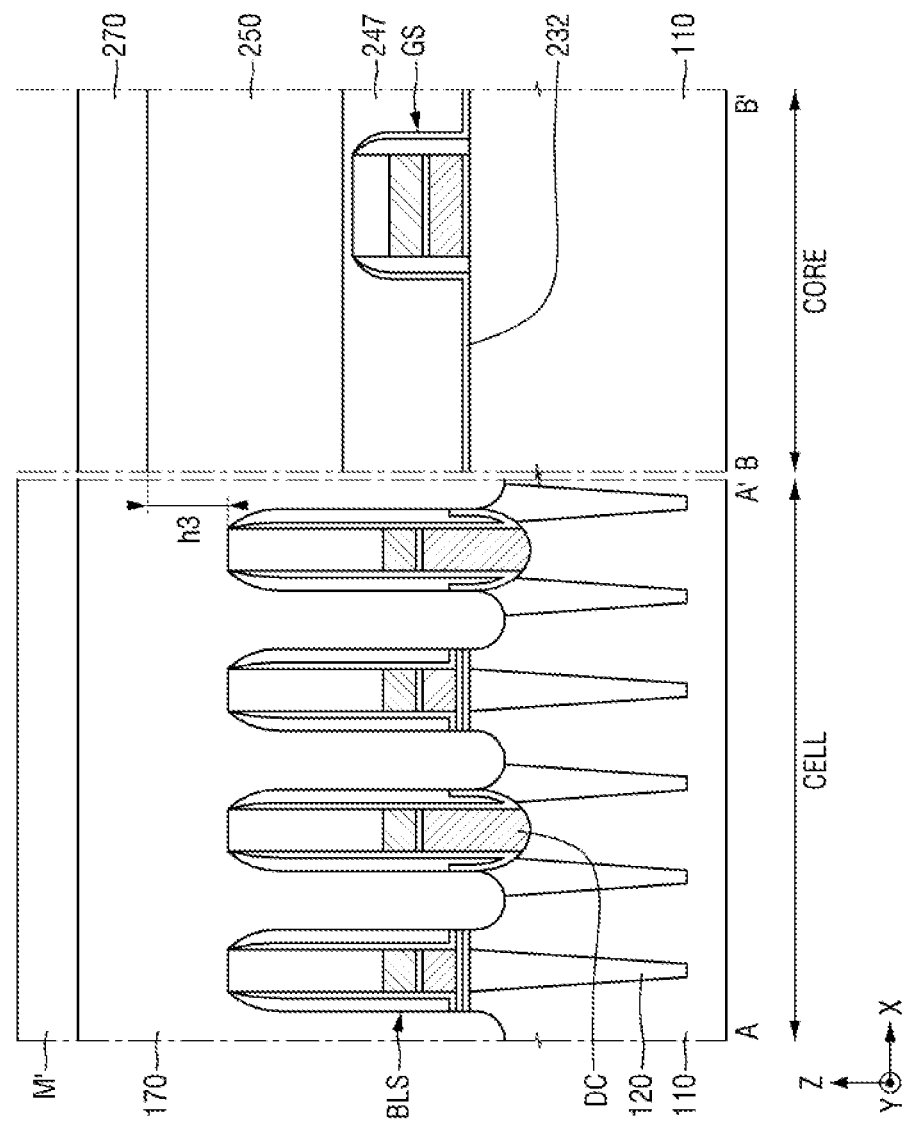

Referring to FIGS. 10 and 11, the upper surface of the core capping film 250 may be exposed using the mask M.

In one embodiment, the etching process may be performed on the cell area CELL and the core area CORE using the mask M as the etch mask. Accordingly, the second contact film 270 formed on the core capping film 250 may be removed to expose the upper surface of the core capping film 250.

As illustrated in FIG. 10, the mask M used as the etch mask may be reduced in thickness during the etching process. In one example, the thickness of the mask M may be reduced during the etching process to become an etched mask M' with reduced thickness after the etching process. However, the present disclosure is not limited to this case, and the mask M used as the etch mask may also be fully consumed and removed in the etching process.

Figure 12:
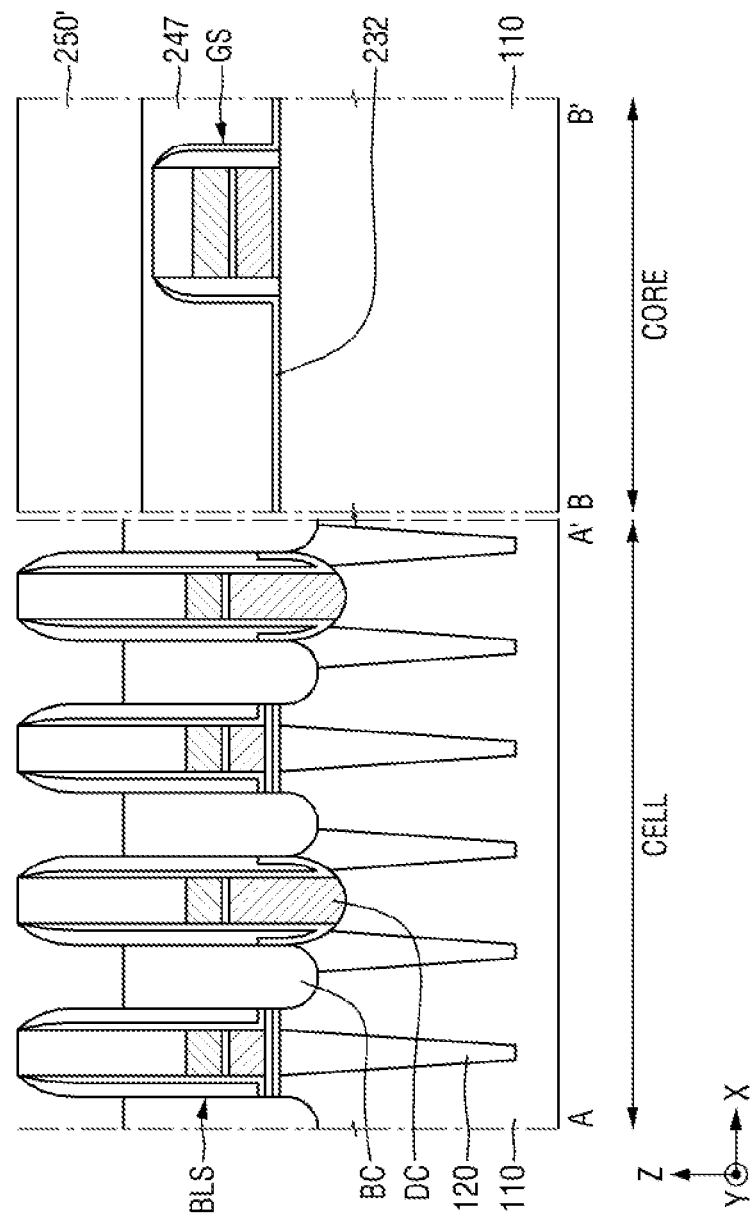

Referring to FIGS. 11 and 12, the first contact film 170 may be etched until the height of the first contact film 170 is less than the heights of the bit line structures BLS. The etched first contact film 170 may form the buried contacts BC. Since the buried contacts BC have been described above with reference to FIG. 3, a detailed description of the buried contacts BC will be omitted.

In one embodiment, using the etching process having a greater etching rate for the first contact film 170 than for the bit line structures BLS and the core capping film 250, the first contact film 170 may be etched until the height of the first contact film 170 becomes lower than the heights of the bit line structures BLS.

Here, the thickness of the core capping film 250 of the core area CORE may be reduced during the etching of the first contact film 170. On the other hand, the bit line structures BLS of the cell area CELL may be protected by the etched mask M' and the first contact film 170 while the core capping film 250 is etched in the etching process.

For example, in the etching process having a greater etching rate for the first contact film 170 than for the bit line structures BLS and the core capping film 250, not only the first contact film 170 but also the bit line structures BLS and the core capping film 250 can be etched. For example, the heights of the bit line structures BLS and the height of the core capping film 250 can be reduced by the etching process.

However, unlike the exposed core capping film 250, the bit line structures BLS may be protected by the etched mask M' and the first contact film 170. A thickness by which the core capping film 250 is etched may be greater than a thickness by which the bit line structures BLS are etched. For example, the etching rate for the core capping film 250 may be faster than the etching rate for the bit line structure BLS. Thus, the third step difference h3 may be reduced.

In some embodiments, as shown in FIG. 12, the heights of the bit line structures BLS after the buried contacts BC are formed by the etching process may be substantially equal to the height of the core capping film 250'. For example, the upper surfaces of the bit line structure BLS after the buried contacts BC are formed may lie in substantially the same plane as the upper surface of the core capping film 250'. In other words, the third step difference h3 may not exist.

Therefore, in the method of fabricating the semiconductor device 100 according to an exemplary embodiment of the inventive concept, the heights of the bit line structures BLS may be formed to be substantially equal to the height of the core capping film 250' by using the mask M. In the method of fabricating the semiconductor device 100 according to one or more exemplary embodiments, a step difference between the bit line structures BLS and the core capping film 250' may be removed. The removed step difference may secure a process margin since the cell area CELL and the core area CORE may be simultaneously processed, thereby facilitating subsequent processes such as the wiring process. For example, the method of fabricating the semiconductor device 100 according to an exemplary embodiment may prevent a pattern defect such as a landing pad pattern defect.

Accordingly, the method of fabricating the semiconductor device 100 according to an exemplary embodiment of the present inventive concept may provide the semiconductor device 100 with increased reliability by securing a process margin for processing the cell area CELL and the core area CORE.

In addition, unlike a planarization process such as CMP, the method of fabricating the semiconductor device 100 according to an exemplary embodiment may reduce a step difference between the cell area CELL and the core area CORE without damaging the bit line structures BLS.

Furthermore, the method of fabricating the semiconductor device 100 according to an exemplary embodiment may reduce the thickness of a finally formed semiconductor device 100 by reducing the step difference between the cell area CELL and the core area CORE. For example, a stack-down effect may be obtained for the finally formed semiconductor device 100.

A method of fabricating a semiconductor device 100 according to one or more exemplary embodiments of the present inventive concept will hereinafter be described with reference to FIGS. 13 through 15. For ease of description, a description of elements and features identical to those described above with reference to FIGS. 1 through 12 will be given briefly or omitted.

Figure 13:
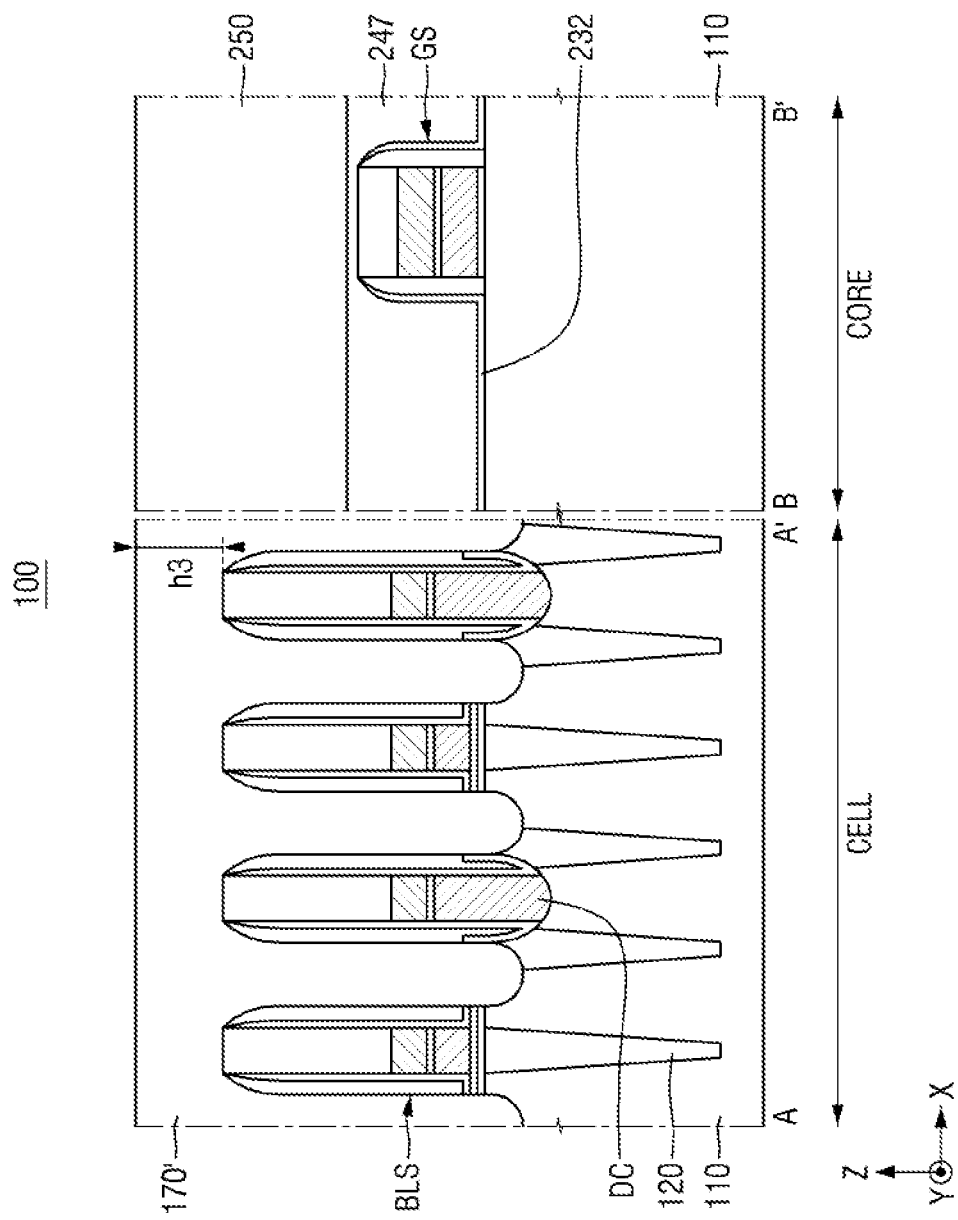
FIGS. 13 through 15 are cross-sectional views illustrating operations of a method of fabricating a semiconductor device according to one or more exemplary embodiments of the present inventive concept.
Figure 14:
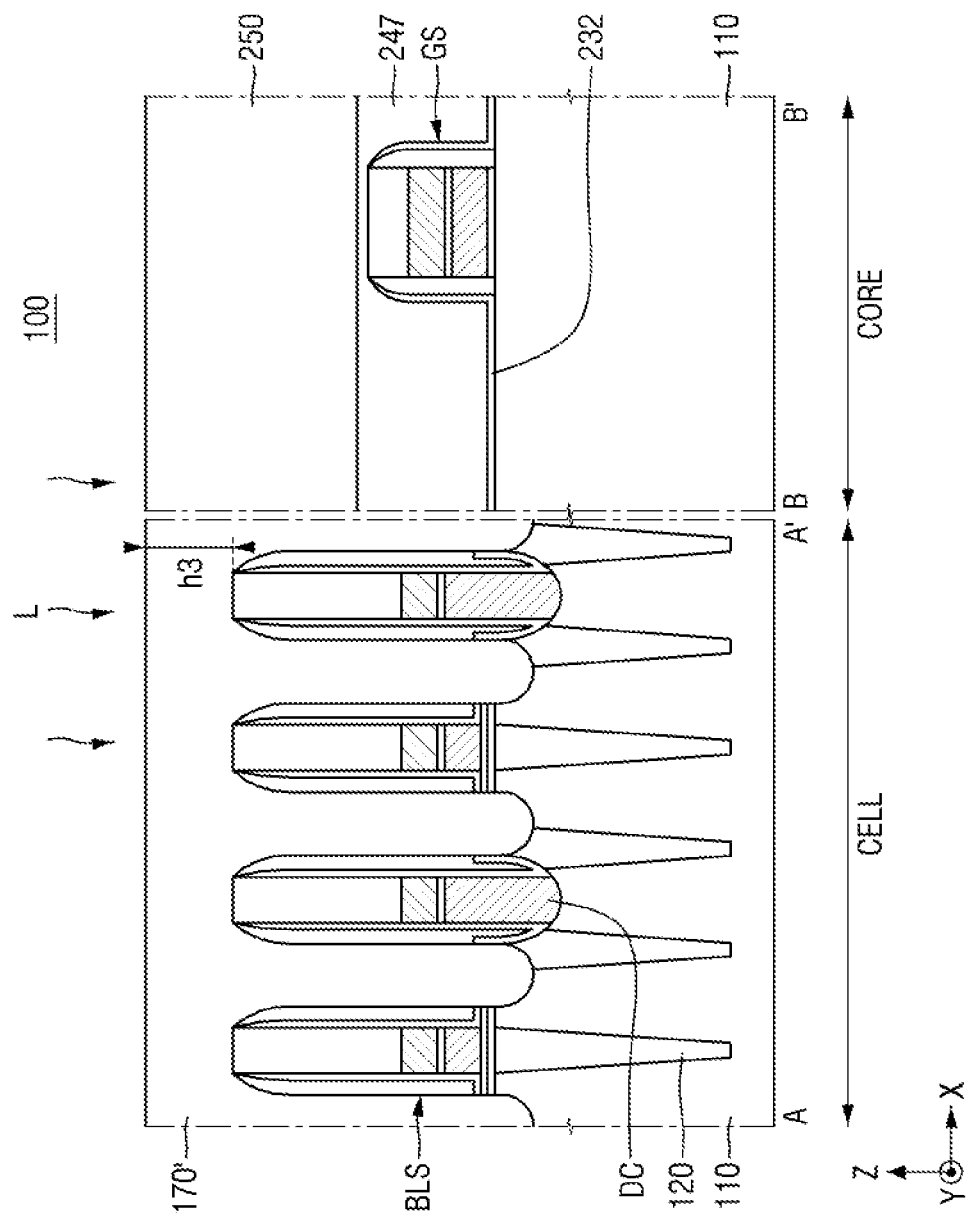
Figure 15:
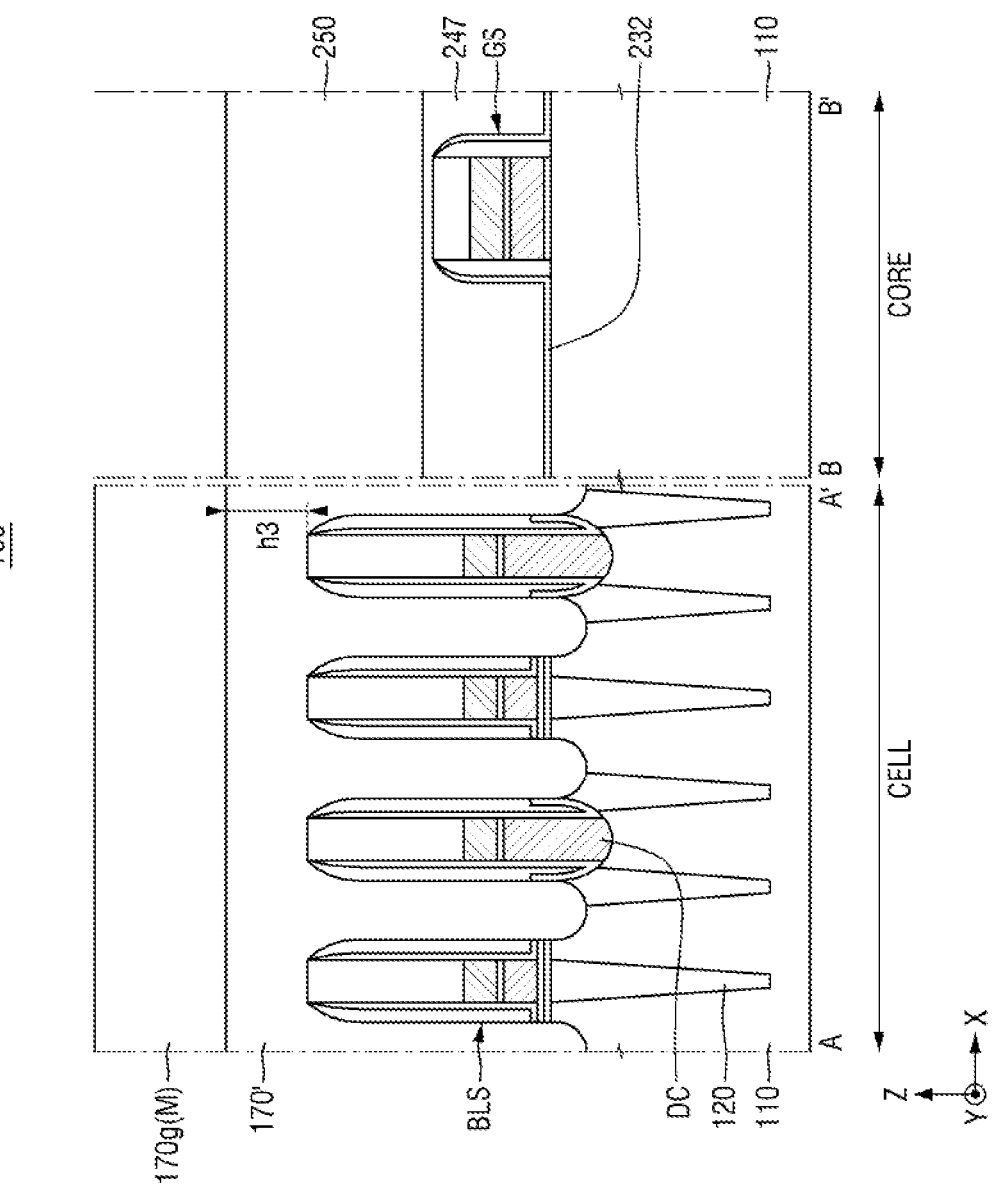

FIGS. 13 through 15 are cross-sectional views illustrating operations of a method of fabricating the semiconductor device 100 according to an exemplary embodiment of the present inventive concept.

Referring to FIGS. 9 and 13, after first and second contact films 170 and 270 are formed, the second contact film 270 may be etched until an upper surface of the core capping film 250 is exposed.

For example, after the first and second contact films 170 and 270 are formed, the second contact film 270 may be etched using end point detection (EPD) until the upper surface of the core capping film 250 is exposed. Here, the EPD may include a method that can be commonly used in the technical field to which the inventive concept pertains. The EPD can be used to detect whether the upper surface of the core capping film 250 is exposed in the process of etching the second contact film 270 and to etch the second contact film 270 until the upper surface of the core capping film 250 is completely exposed. Accordingly, the second contact film 270 on the core capping film 250 can be completely removed by using the EPD.

For simplicity of the process, the first contact film 170 may be etched together with the second contact film 270 as illustrated in the drawings. For example, the upper surface of the first contact film 170' may lie in substantially the same plane as the upper surface of the core capping film 250 as shown in FIG. 13.

However, the present disclosure is not limited to this case. In another embodiment, only the second contact film 270, not together with the first contact film 170, may be etched to expose the upper surface of the core capping film 250. In this case, the height of the upper surface of the first contact film 170' may be greater than the height of the upper surface of the core capping film 250.

In some embodiments, after the first contact film 170' is formed, a laser annealing may be performed on the first contact film 170'.

FIG. 14 illustrates that the laser annealing L may be performed on the first contact film 170'. In an embodiment where the first contact film 170' includes polysilicon, the laser annealing L may be performed to crystallize the polysilicon. Thus, the growth of polysilicon may be facilitated. This will be described with reference to FIG. 15.

Referring to FIG. 15, the first contact film 170' may be grown.

For example, the crystal structure of the first contact film 170' may be grown to form a grown first contact film 170g. The grown first contact film 170g may correspond to the mask M of FIG. 10.

The first contact film 170' may include polysilicon, and the first contact film 170' may be grown by epitaxial growth of polysilicon crystals. For example, when liquid phase epitaxy (LPE) is used, a saturated solution containing polysilicon may be brought into contact with a substrate to grow crystals, thereby forming the grown first contact film 170g.

Prior to the formation of the grown first contact film 170g, the laser annealing L may be performed on the first contact film 170' as illustrated in FIG. 14. The laser annealing L may crystallize the crystal structure of the first contact film 170' in a more precise way. Accordingly, the laser annealing L may expedite the crystallization of the first contact film 170' in a more precise way. However, the present disclosure is not limited to this case, and, for simplification of the process, the first contact film 170' may also be grown without the laser annealing.

In some embodiments, the first contact film 170' may include polysilicon, and the polysilicon may be grown using a silicon migration process or a SiGe low-temperature growth process (for example, a P—SiGe low-temperature growth process). In addition, the laser annealing L may be performed on the first contact film 170' before the first contact film 170' is grown using the silicon migration process or the SiGe low-temperature growth process. Accordingly, the laser annealing L may expedite the formation of the grown first contact film 170g. In one example, the grown first contact film 170g may be formed only in the cell area CELL to protect the bit line structures BLS in the process of forming buried contacts BC, as described above with reference to FIGS. 10 through 12.

The grown first contact film 170g and the first contact film 170 may be etched until the height of the grown first contact film 170g and the first contact film 170 is less than the heights of the bit line structures BLS. In this example, the grown first contact film 170g may be substantially etched away in the etching process. The etched first contact film 170 may form the buried contacts BC (not shown in FIG. 15). Since the buried contacts BC have been described above with reference to FIG. 3, a detailed description of the buried contacts BC will be omitted.

In one embodiment, the etching process may be performed where the etching rates for the grown first contact film 170g and the first contact film 170 may be greater than the etching rates for the bit line structures BLS, and the core capping film 250.

Therefore, in the method of fabricating the semiconductor device 100 according to one or more exemplary embodiments of the inventive concept, the heights of the bit line structures BLS may be made substantially equal to the height of the core capping film 250' using the grown first contact film 170g as the mask. For example, in the method of fabricating the semiconductor device 100 according to one or more exemplary embodiments, a step difference between the bit line structures BLS and the core capping film 250' may be removed. The removed step difference may secure a process margin since the cell area CELL and a core area CORE may be simultaneously processed, thereby facilitating subsequent processes such as the wiring process.

Accordingly, the method of fabricating a semiconductor device 100 according to one or more exemplary embodiments of the present inventive concept may provide the semiconductor device 100 with increased reliability by securing a process margin for processing the cell area CELL and the core area CORE.

In addition, using the grown first contact film 170g as the mask may simplify the process, and lower manufacturing cost of the semiconductor device 100, compared with forming a mask in a separate process.

A method of fabricating the semiconductor device 100 according to an exemplary embodiment of the present inventive concept will hereinafter be described with reference to FIGS. 16 through 18. For ease of description, a description of elements and features identical to those described above with reference to FIGS. 1 through 15 will be given briefly or omitted.

Figure 16:
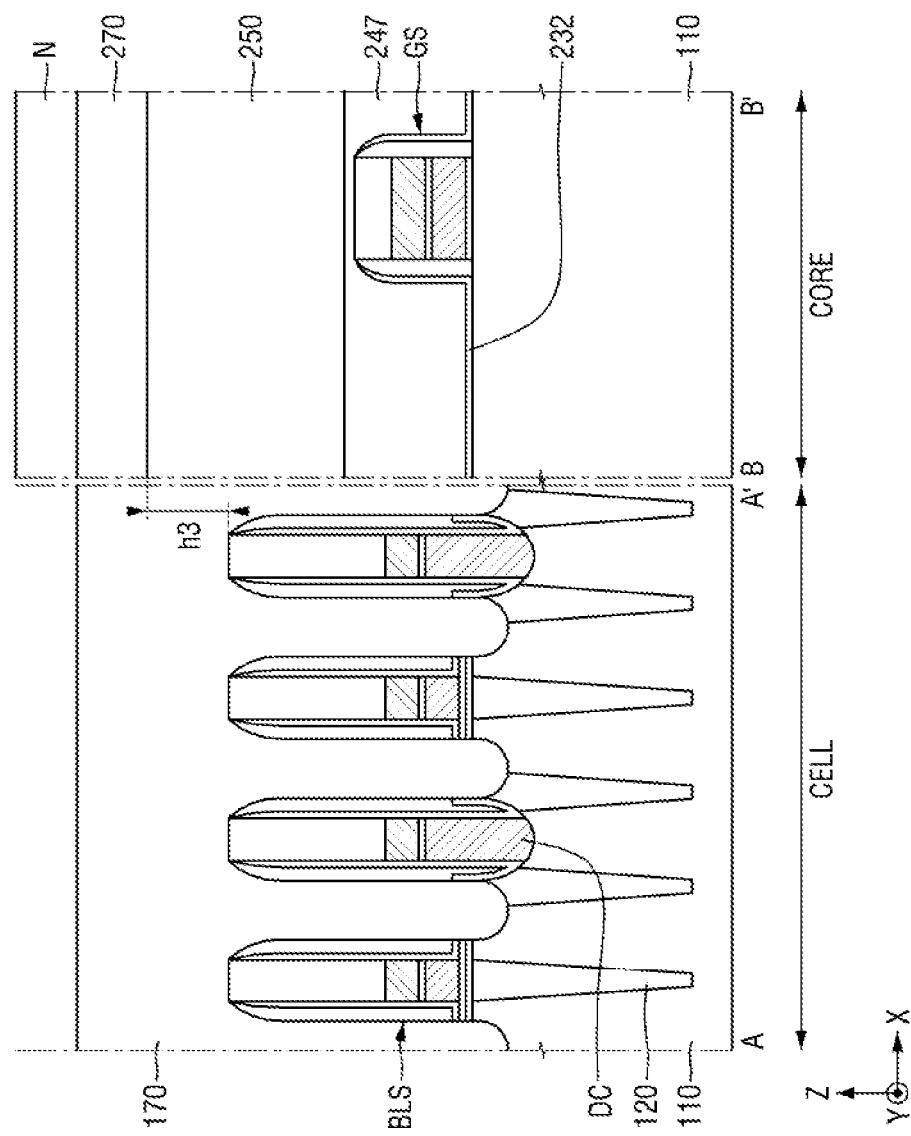
FIGS. 16 through 18 are cross-sectional views illustrating operations of a method of fabricating a semiconductor device according to one or more exemplary embodiments of the present inventive concept.
Figure 17:
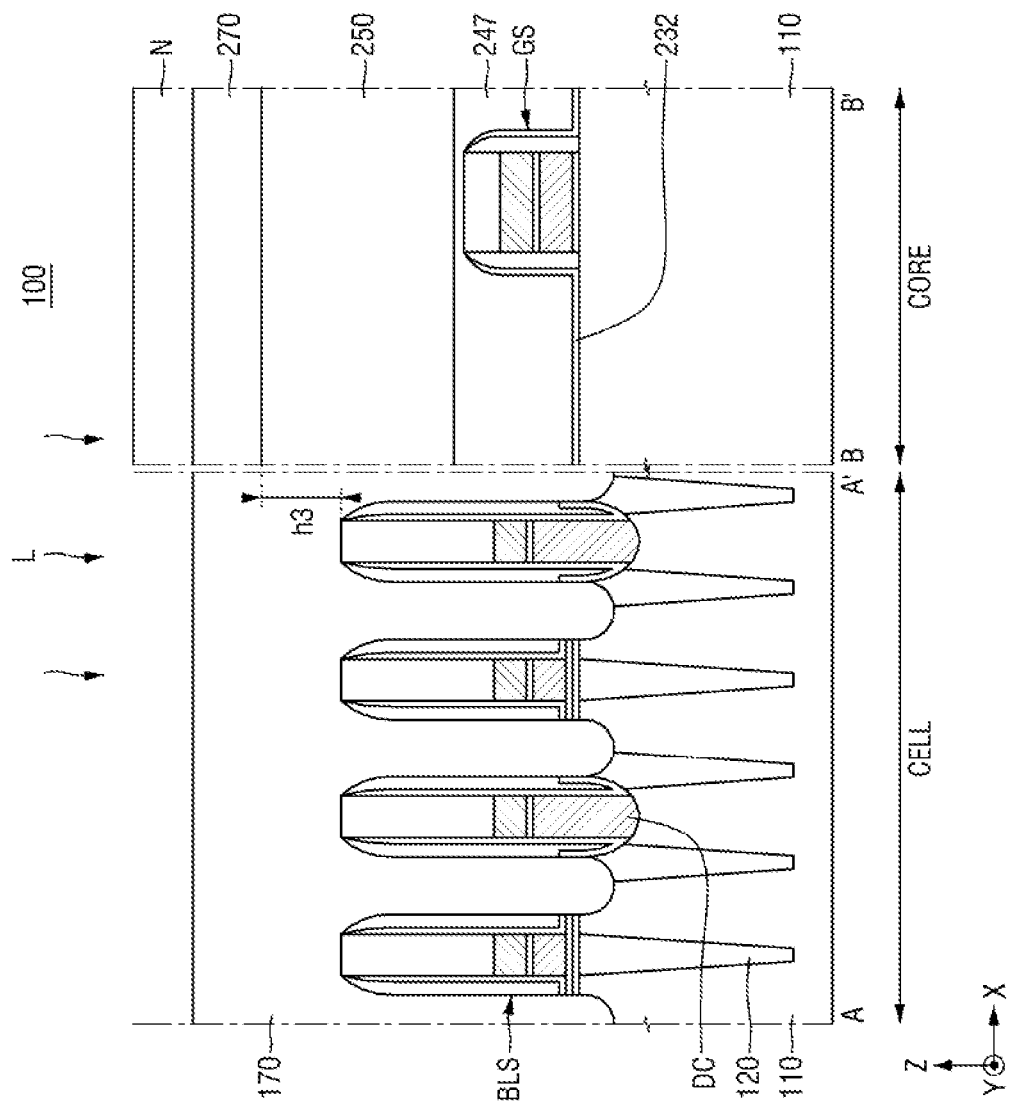
Figure 18:
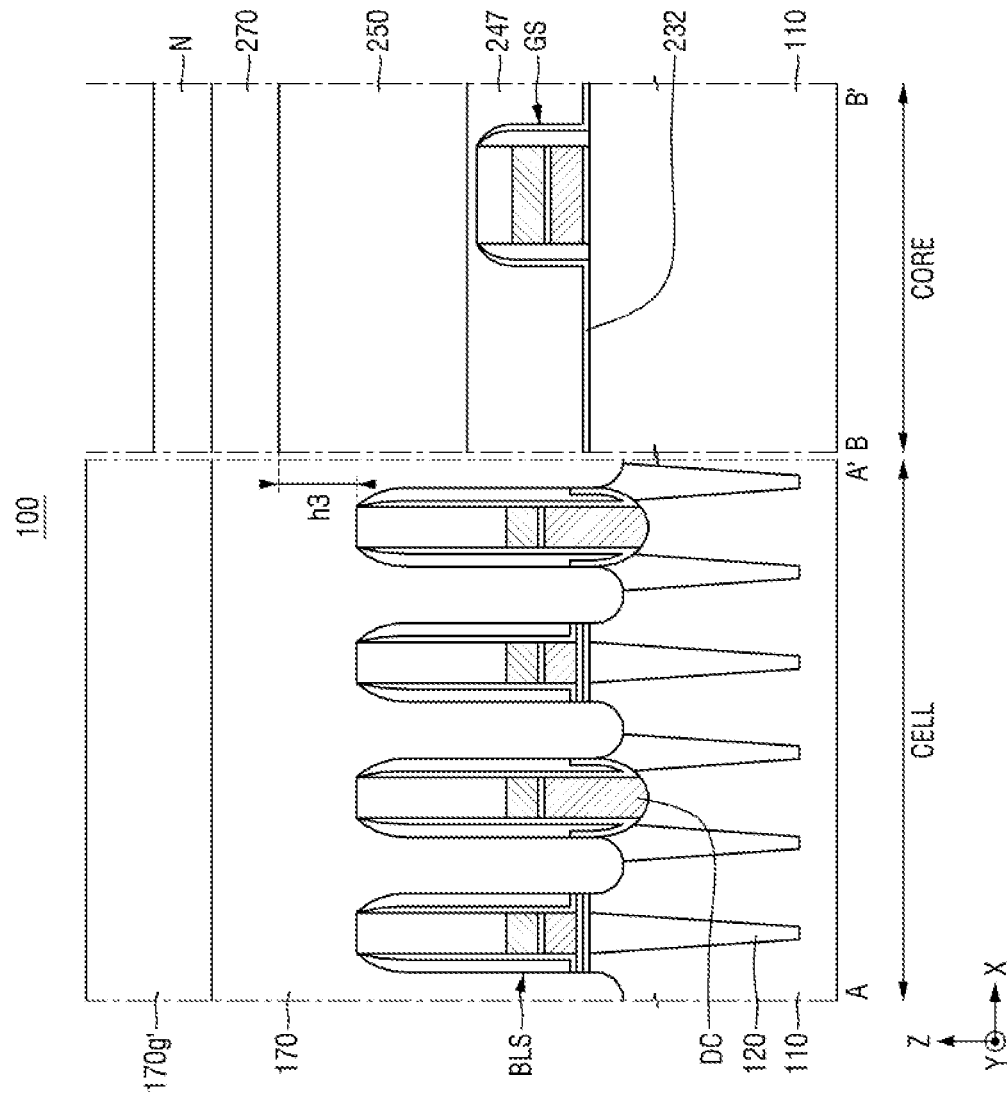

FIGS. 16 through 18 are cross-sectional views illustrating operations of a method of fabricating the semiconductor device 100 according to one or more exemplary embodiments of the present inventive concept.

Referring to FIG. 16, a blocking mask N may be formed on the second contact film 270. In some embodiments, the blocking mask N may be formed on the second contact film 270 by the photolithography process. For example, the blocking mask N may be photoresist.

In one embodiment, the photoresist may be formed on the first and second contact films 170 and 270, and the photoresist formed on the first contact film 170 may be removed through exposure and development. For example, when the positive photolithography process is used, the photoresist may be formed on the first and second contact films 170 and 270, and the photoresist formed on the first contact film 170 may be exposed. Then, the exposed photoresist on the first contact film 170 may be removed by development. The photoresist on the second contact film 270 may be formed as the blocking mask N.

Referring to FIG. 17, after the formation of the blocking mask N on the second contact film 270, the laser annealing L may be performed on the first contact film 170. The first contact film 170 may include the polysilicon, and the polysilicon may be crystallized by the laser annealing L. Here, the laser annealing L may not be performed on the second contact film 270 due to the blocking mask N.

Referring to FIG. 18, the first contact film 170 may be grown.

For example, the crystal structure of the first contact film 170 may be grown to form a grown first contact film 170g'. The grown first contact film 170g' may correspond to the grown first contact film 170g of FIG. 15.

The grown first contact film 170g' formed using the blocking mask N may not be formed on the second contact film 270. For example, the grown first contact film 170g' may be formed only in a cell area CELL to protect bit line structures BLS in the process of forming buried contacts.

The grown first contact film 170g' and the first contact film 170 may be etched until the grown first contact film 170g' and the height of the first contact film 170 is less than the heights of the bit line structures BLS. In this example, the grown first contact film 170g' may be substantially etched away during the etching process. The etched first contact film 170 may form the buried contacts BC (not shown in FIG. 18). Since the buried contacts BC have been described above with reference to FIG. 3, a detailed description of the buried contacts BC will be omitted.

In one embodiment, the etching process may be performed where the etching rates for the grown first contact film 170g' and the first contact film 170 may be greater than the etching rates for the bit line structures BLS, the blocking mask N, the second contact film 270, and the core capping film 250.

Therefore, in the method of fabricating the semiconductor device 100 according to an exemplary embodiment of the present inventive concept, the heights of the bit line structures BLS may be made substantially equal to the height of the core capping film 250 using the grown first contact film 170g' and the blocking mask N as the masks. For example, in the method of fabricating the semiconductor device 100 according to an exemplary embodiment, a step difference between the bit line structures BLS and the core capping film 250' may be removed. The removed step difference may secure a process margin for simultaneously processing the cell area CELL and a core area CORE, thereby facilitate the subsequent processes such as the wiring process.

Accordingly, the method of fabricating the semiconductor device 100 according to an exemplary embodiment of the current inventive concept may provide the semiconductor device 100 with increased reliability by securing a process margin for processing the cell area CELL and the core area CORE.

A method of fabricating a semiconductor device 100 according to one or more exemplary embodiments of the present inventive concept will hereinafter be described with reference to FIG. 19. For ease of description, a description of elements and features identical to those described above with reference to FIGS. 1 through 18 will be given briefly or omitted.

Figure 19:
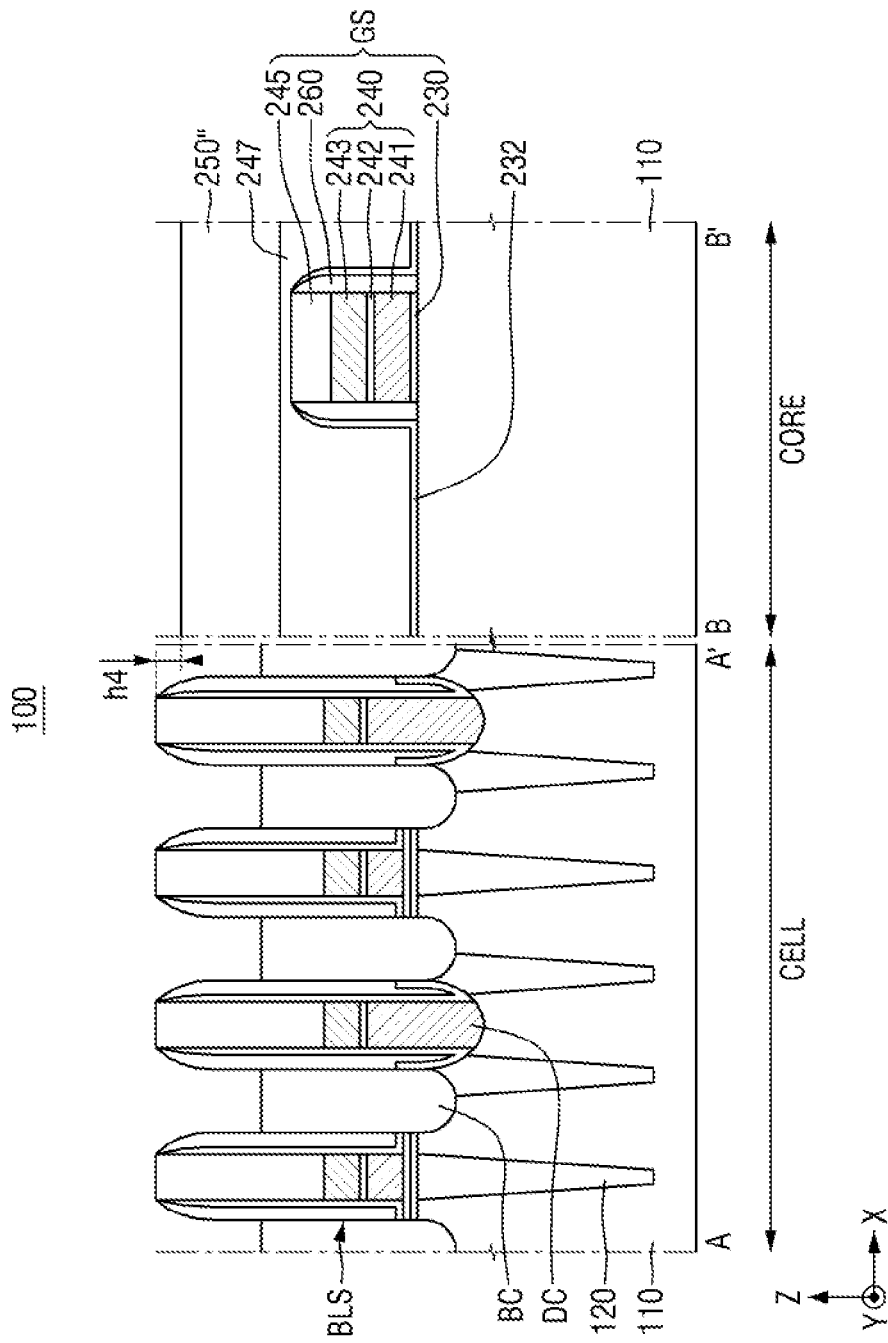
FIG. 19 is a cross-sectional view illustrating operations of a method of fabricating a semiconductor device according to an exemplary embodiment of the present inventive concept.

FIG. 19 is a cross-sectional view illustrating operations of a method of fabricating a semiconductor device 100 according to embodiments of the present inventive concept.

Referring to FIGS. 11 and 19, a first contact film 170 may be etched until the height of the first contact film 170 becomes less than the heights of bit line structure BLS, thereby forming buried contacts BC. Since the buried contacts BC were described above with reference to FIG. 3, a detailed description of the buried contacts BC will be omitted.

In one embodiment, using an etching process having a greater etching rate for the first contact film 170 than for the bit line structures BLS and a core capping film 250, the first contact film 170 may be etched until the height of the first contact film 170 becomes less than the heights of the bit line structures BLS.

In some embodiments, the heights of the bit line structures BLS after the buried contacts BC are formed by the etching process may be greater than the height of the core capping film 250'. For example, the upper surfaces of the bit line structures BLS after the buried contacts BC are formed may be higher than an upper surface of the core capping film 250'. In other words, a step difference between a cell area CELL and a core area CORE may be reversed to generate a fourth step difference h4.

In some embodiments, the step difference between the cell area CELL and the core area CORE can be adjusted.

In one embodiment, the magnitude of the fourth step difference h4 may be adjusted by adjusting the thickness of the mask M of FIG. 10. For example, the thickness of the mask M may be proportional to the size of the fourth step difference h4. In one example, when the thickness of the mask M of FIG. 10 increases, the size of the corresponding fourth step difference h4 may also increase. In another example, when the thickness of the mask M of FIG. 10 decreases, the size of the corresponding fourth step difference h4 may decrease.

The size of the fourth step difference h4 may be adjusted by adjusting the etch selectivity of the mask M and/or the first contact film 170 with respect to the bit line structures BLS and the core capping film 250. For example, when the etch selectivity of the mask M and/or the first contact film 170 with respect to the bit line structures BLS and the core capping film 250 is small, the fourth step difference h4 may be formed large. In another example, when the etch selectivity of the mask M and/or the first contact film 170 with respect to the bit line structures BLS and the core capping film 250 is large, the fourth step difference h4 may be formed small.

As illustrated in FIG. 12, in an embodiment where the bit line structures BLS and the core capping film 250' may be formed to have substantially the same height, a step difference can be generated later in a subsequent process. Therefore, in the method of fabricating the semiconductor device 100 according to exemplary embodiments of the present inventive concept, more process margin may be secured if necessary by adjusting the step difference for the bit line structures BLS and the core capping film 250'.

Thus, the method of fabricating the semiconductor device 100 according to one or more exemplary embodiments can provide the semiconductor device 100 with increased reliability by securing more process margin for processing the cell area CELL and the core area CORE.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device, comprising: a substrate including a cell area and a core area;
    a bit line structure disposed on the cell area;
    a plurality of landing pads disposed on the bit line structure, each of the plurality of landing pads being electrically connected to the substrate;
    a first interlayer insulating film including a first portion that is between the plurality of landing pads, and a second portion that is disposed on the first portion and on upper surfaces of the plurality of landing pads; a capacitor disposed on one of the plurality of landing pads;
    a gate structure disposed on the core area; a plurality of interconnection patterns disposed on the gate structure; and
    a second interlayer insulating film including a third portion that is disposed between the plurality of interconnection patterns, and a fourth portion that is disposed on the third portion and on upper surfaces of the plurality of interconnection patterns, wherein an upper surface of the second portion of the first interlayer insulating film and an upper surface of the fourth portion of the second interlayer insulating film lie in a same plane, and the first portion and the second portion of the first interlayer insulating film are directly connected to each other, wherein the first portion is in direct contact with the bit line structure, and wherein the second portion is not in direct contact with the bit line structure.

2. The semiconductor device of claim 1, wherein the first portion of the first interlayer insulating film and the second portion of the first interlayer insulating film are materially of a same composition, and
    the third portion of the second interlayer insulating film and the fourth portion of the second interlayer insulating film are materially of a same composition.

3. The semiconductor device of claim 1, wherein the upper surfaces of the plurality of landing pads and the upper surfaces of the plurality of interconnection patterns lie in a same plane.

4. The semiconductor device of claim 1, wherein a height of a lower surface of the first portion of the first interlayer insulating film from an upper surface of the substrate is lower than a height of an upper surface of the bit line structure from the upper surface of the substrate.

5. The semiconductor device of claim 4, wherein at least a portion of the first portion of the first interlayer insulating film vertically overlaps the bit line structure.

6. The semiconductor device of claim 1, further comprising:
    a buried contact on a sidewall of the bit line structure, the buried contact connecting the substrate and one of the plurality of landing pads; and
    a core insulating film covering the gate structure.

7. The semiconductor device of claim 6, wherein a height of an upper surface of the buried contact from an upper surface of the substrate is higher than a height of an upper surface of the core insulating film from the upper surface of the substrate.

8. The semiconductor device of claim 1, further comprising a core capping film disposed on the gate structure,
    wherein the plurality of interconnection patterns extends along an upper surface of the core capping film,
    the bit line structure includes a bit line conductive film, and a bit line capping film extending along an upper surface of the bit line conductive film, and
    an upper surface of the bit line capping film and the upper surface of the core capping film lie in a same plane.

9. The semiconductor device of claim 8, wherein the core capping film includes a trench extending from the upper surface of the core capping film, and
    the third portion of the second interlayer insulating film fills the trench of the core capping film.

10. The semiconductor device of claim 1, further comprising a direct contact plug connecting the substrate and at least one of the plurality of interconnection patterns.

11. A semiconductor device, comprising:
    a substrate including a cell area and a core area;
    a bit line structure disposed on the cell area;
    a buried contact on a sidewall of the bit line structure, the buried contact being in contact with the substrate;
    a plurality of landing pads disposed on the bit line structure, one of the plurality of landing pads disposed on the buried contact;
    a plurality of lower electrodes disposed on the plurality of landing pads;
    a dielectric film disposed on the plurality of lower electrodes;
    an upper electrode disposed on the dielectric film;
    a first interlayer insulating film including a first portion that separates the plurality of landing pads from each other, and a second portion that separates the plurality of lower electrodes from each other;
    a gate structure disposed on the core area;
    a core insulating film covering the gate structure;
    a core capping film disposed on the core insulating film;

a plurality of interconnection patterns disposed on the core capping film; and
a second interlayer insulating film including a third portion that separates the plurality of interconnection patterns from each other, and a fourth portion that extends along upper surfaces of the plurality of interconnection patterns,
wherein an upper surface of the second portion of the first interlayer insulating film and an upper surface of the fourth portion of the second interlayer insulating film lie in a same plane.

12. The semiconductor device of claim 11, wherein the first portion of the first interlayer insulating film and the second portion of the first interlayer insulating film are integrally formed, and
the third portion of the second interlayer insulating film and the fourth portion of the second interlayer insulating film are integrally formed.

13. The semiconductor device of claim 11, wherein upper surfaces of the plurality of landing pads and the upper surfaces of the plurality of interconnection patterns lie in a same plane.

14. The semiconductor device of claim 11, wherein a height of a lower surface of the first portion of the first interlayer insulating film from an upper surface of the substrate is lower than a height of an upper surface of the bit line structure from the upper surface of the substrate.

15. The semiconductor device of claim 14, wherein at least a portion of the first portion of the first interlayer insulating film vertically overlaps the bit line structure.

16. The semiconductor device of claim 11, wherein a height of an upper surface of the buried contact from an upper surface of the substrate is higher than a height of an upper surface of the core insulating film from the upper surface of the substrate.

17. The semiconductor device of claim 11, wherein the bit line structure includes a bit line conductive film, and a bit line capping film extending along an upper surface of the bit line conductive film, and
an upper surface of the bit line capping film and an upper surface of the core capping film lie in a same plane.

18. The semiconductor device of claim 17, wherein the core capping film includes a trench extending from the upper surface of the core capping film, and
the third portion of the second interlayer insulating film fills the trench of the core capping film.

19. A semiconductor device, comprising:
a substrate including a cell area and a core area;
a bit line structure disposed on the cell area;
a first landing pad on one side of the bit line structure, the first landing pad being electrically connected to a portion of the substrate;
a second landing pad on the other side of the bit line structure, the second landing pad being electrically connected to the other portion of the substrate;
a first lower electrode connected to the first landing pad;
a second lower electrode connected to the second landing pad;
a first interlayer insulating film including a first portion that separates the first landing pad and the second landing pad from each other, and a second portion that separates the first lower electrode and the second lower electrode from each other;
a gate structure disposed on the core area;
a first interconnection pattern and a second interconnection pattern disposed on the gate structure; and
a second interlayer insulating film including a third portion that separates the first interconnection pattern and the second interconnection pattern from each other, and a fourth portion that is disposed on the third portion and on upper surfaces of the first interconnection pattern and the second interconnection pattern,
wherein an upper surface of the second portion of the first interlayer insulating film and an upper surface of the fourth portion of the second interlayer insulating film lie in a same plane,
the first portion of the first interlayer insulating film and the second portion of the first interlayer insulating film are integrated, and
the third portion of the second interlayer insulating film and the fourth portion of the second interlayer insulating film are integrated.

20. A semiconductor device, comprising:
a substrate including a cell area and a core area, the cell area having a first active region and a second active region, and the core area having a third active region;
a plurality of bit line structures disposed on the cell area, each of the plurality of bit line structures including a bit line conductive film and a bit line capping film on the bit line conductive film;
a plurality of buried contacts disposed on the substrate and electrically connected to the first active region, one of the plurality of buried contacts being disposed between the plurality of bit line structures;
a first direct contact plug disposed between an end of the second active region and one of the plurality of bit line structures;
a plurality of landing pads disposed on the plurality of buried contacts;
a first interlayer insulating film including a plurality of first portions and a second portion, one of the plurality of first portions disposed between the plurality of landing pads and being in contact with the bit line capping film and sidewalls of the plurality of landing pads, and the second portion disposed on the plurality of first portions and on the plurality of landing pads and including a plurality of through-holes that expose the plurality of landing pads;
a plurality of lower electrodes of a capacitor disposed on the plurality of landing pads through the plurality of through-holes;
a gate structure disposed on the core area;
a core capping film disposed on the gate structure;
a plurality of interconnection patterns disposed on the core capping film;
a second direct contact plug connecting the third active region and one of the plurality of interconnection patterns and passing through the core capping film; and
a second interlayer insulating film including a plurality of third portions and a fourth portion, one of the plurality of third portions disposed between the plurality of interconnection patterns and being in contact with the core capping film, and the fourth portion disposed on the plurality of third portions and on the plurality of interconnection patterns,
wherein an upper surface of the second portion of the first interlayer insulating film and an upper surface of the fourth portion of the second interlayer insulating film lie in a same plane,
an upper surface of one of the plurality of landing pads and an upper surface of one of the plurality of interconnection patterns lie in a same plane, an upper surface of the bit line capping film and an upper surface of the core capping film lie in a same plane, the plurality of first portions of the first interlayer insulating film and the second portion of the first interlayer insulating film are integrated, and the plurality of third portions of the second interlayer insulating film and the fourth portion of the second interlayer insulating film are integrated.

\* \* \* \* \*